US011211293B2

United States Patent
Su et al.

(10) Patent No.: US 11,211,293 B2
(45) Date of Patent: Dec. 28, 2021

(54) FINFET DEVICE AND METHODS OF FORMING THE SAME

(71) Applicant: Taiwan Semiconductor Manufacturing Co., Ltd., Hsinchu (TW)

(72) Inventors: Huan-Chieh Su, Changhua County (TW); Chih-Hao Wang, Hsinchu County (TW); Wei-Hao Wu, Hsinchu (TW); Zhi-Chang Lin, Hsinchu County (TW); Jia-Ni Yu, New Taipei (TW); Chung-Wei Hsu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 53 days.

(21) Appl. No.: 16/231,613

(22) Filed: Dec. 24, 2018

(65) Prior Publication Data
US 2020/0043794 A1 Feb. 6, 2020

Related U.S. Application Data

(60) Provisional application No. 62/712,231, filed on Jul. 31, 2018.

(51) Int. Cl.
*H01L 21/8234* (2006.01)
*H01L 21/762* (2006.01)
(Continued)

(52) U.S. Cl.
CPC .. *H01L 21/823431* (2013.01); *H01L 21/3086* (2013.01); *H01L 21/76832* (2013.01);
(Continued)

(58) Field of Classification Search
CPC .......... H01L 29/66545; H01L 29/1054; H01L 29/42392; H01L 21/823821;
(Continued)

(56) References Cited

U.S. PATENT DOCUMENTS 8,796,666 B1 8/2014 Huang et al.
8,815,712 B2 8/2014 Wan et al.
(Continued)

*Primary Examiner* — Brian Turner
(74) *Attorney, Agent, or Firm* — JCIPRNET

(57) ABSTRACT

FinFET device and method of forming the same are provided. The method of forming the FinFET device includes the following steps. A substrate having a plurality of fins is provided. An isolation structure is on the substrate surrounding lower portions of the fins. A hybrid fin is formed aside the fins and on the isolation structure. A plurality of gate lines and a dielectric layer are formed. The gate lines are across the fins and the hybrid fin, the dielectric layer is aside the gate lines. A portion of the gate lines is removed, so as to form first trenches in the dielectric layer and in the gate lines, exposing a portion of the hybrid fin and a portion of the fins underlying the portion of the gate lines. The portion of the fins exposed by the first trench and the substrate underlying thereof are removed, so as to form a second trench under the first trench. An insulating structure is formed in the first trench and the second trench.

20 Claims, 40 Drawing Sheets

(51) Int. Cl.
*H01L 29/66* (2006.01)
*H01L 27/088* (2006.01)
*H01L 29/78* (2006.01)
*H01L 21/308* (2006.01)
*H01L 29/423* (2006.01)
*H01L 21/768* (2006.01)

(52) U.S. Cl.
CPC ........ *H01L 21/823468* (2013.01); *H01L 21/823475* (2013.01); *H01L 21/823481* (2013.01); *H01L 27/0886* (2013.01); *H01L 29/4236* (2013.01); *H01L 29/6656* (2013.01); *H01L 29/6681* (2013.01); *H01L 29/66545* (2013.01); *H01L 29/7851* (2013.01)

(58) Field of Classification Search
CPC ....... H01L 21/823878; H01L 29/78696; H01L 27/0924; H01L 29/165; H01L 21/823807; H01L 29/0653; H01L 29/7849
See application file for complete search history.

(56) References Cited

U.S. PATENT DOCUMENTS

| | | | |
|---|---|---|---|
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 2013/0309838 A1* | 11/2013 | Wei .................. | H01L 21/823821 438/424 |
| 2017/0140992 A1* | 5/2017 | Chang ............... | H01L 29/66795 |
| 2017/0141211 A1* | 5/2017 | Xie ....................... | H01L 29/785 |
| 2017/0278928 A1* | 9/2017 | Tung ................... | H01L 21/02634 |
| 2017/0352559 A1* | 12/2017 | Liu ..................... | H01L 21/67063 |
| 2018/0069000 A1* | 3/2018 | Bergendahl ..... | H01L 21/823468 |
| 2019/0326177 A1* | 10/2019 | Economikos ..... | H01L 21/76264 |

* cited by examiner

FINFET DEVICE AND METHODS OF FORMING THE SAME

CROSS-REFERENCE TO RELATED APPLICATION

This application claims the priority benefit of U.S. provisional application Ser. No. 62/712,231, filed on Jul. 31, 2018. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs.

Such scaling down has also increased the complexity of manufacturing ICs and, for these advances to be realized, similar developments in IC manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying FIGS. It is noted that, in accordance with the standard practice in the industry, various features are not drawn to scale. In fact, the critical dimensions of the various features may be arbitrarily increased or reduced for clarity of discussion.

FIGS. 2A and 2B to FIGS. 12A and 12B are schematic cross-sectional views of a method of forming a FinFET device in accordance with the first embodiment of the disclosure. FIG. 2A to FIG. 12A are cross-sectional views taking along line I-I' and line II-II' of FIG. 1A to FIG. 1F. FIG. 2B to FIG. 12B are cross-sectional views taking along line III-III' of FIG. 1A to FIG. 1F.

FIGS. 14A and 14B to FIGS. 15A and 15B are schematic cross-sectional views of middle steps of a method of forming a FinFET device in accordance with a second embodiment of the disclosure. FIG. 14A to FIG. 15A are cross-sectional views taking along line I-I' and line II-II' of FIG. 13A or 13B. FIG. 14B to FIG. 15B are cross-sectional views taking along line III-III' of FIG. 13A or 13B.

DETAILED DESCRIPTION

Figure 1A:
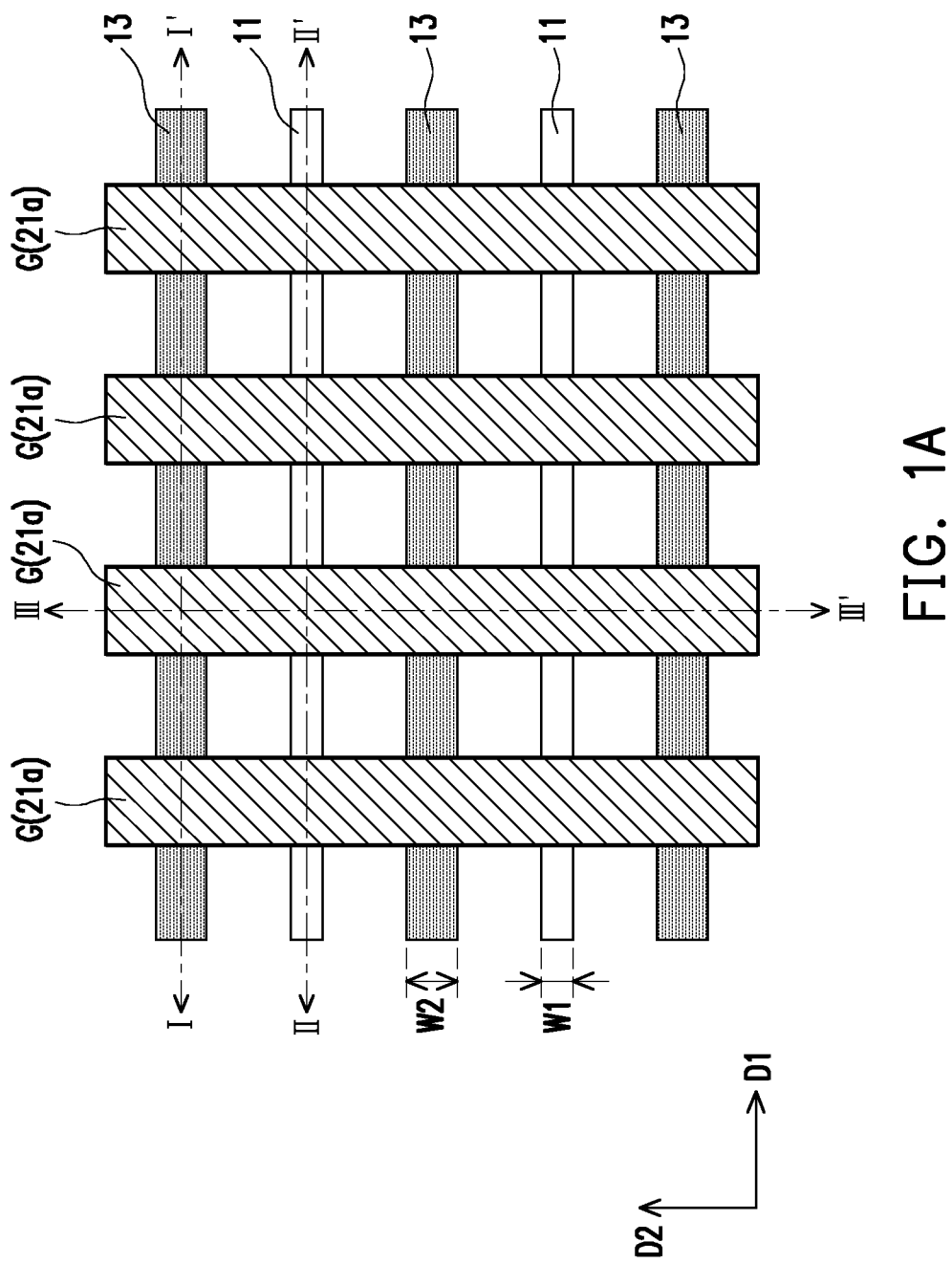
FIG. 1A to FIG. 1F are simplified top views of a method of forming a FinFET device in accordance with a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1A to FIG. 1F are simplified top views of a method of forming a FinFET device in accordance with a first embodiment of the disclosure, in which few elements such as fins, hybrid fins, gate lines, and insulating structures are shown for simplicity and clarity of illustration. FIGS. 2A and 2B to FIGS. 12A and 12B are schematic cross-sectional views of a method of forming a FinFET device in accordance with the first embodiment of the disclosure.

Figure 2A:
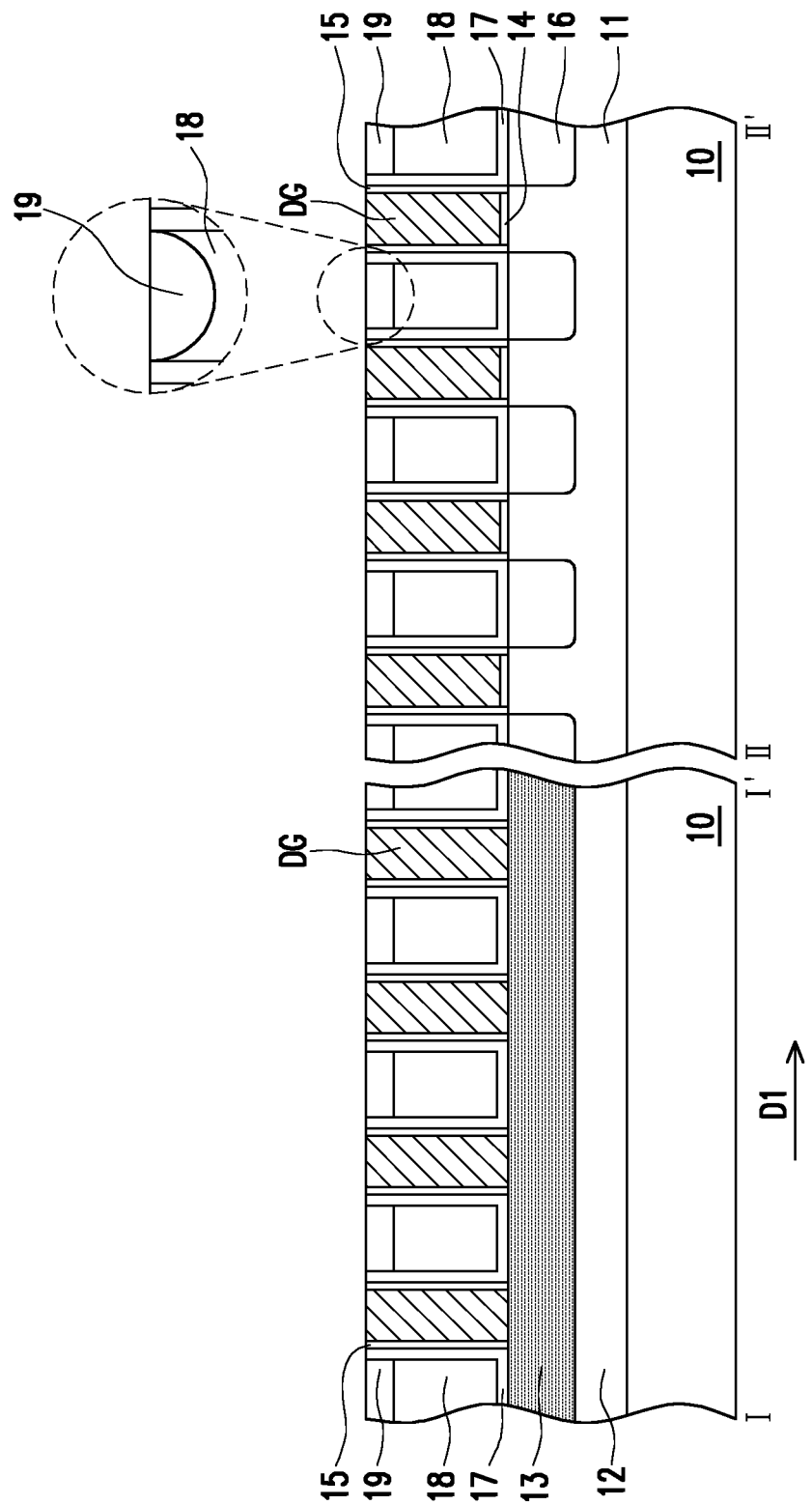
Figure 2B:
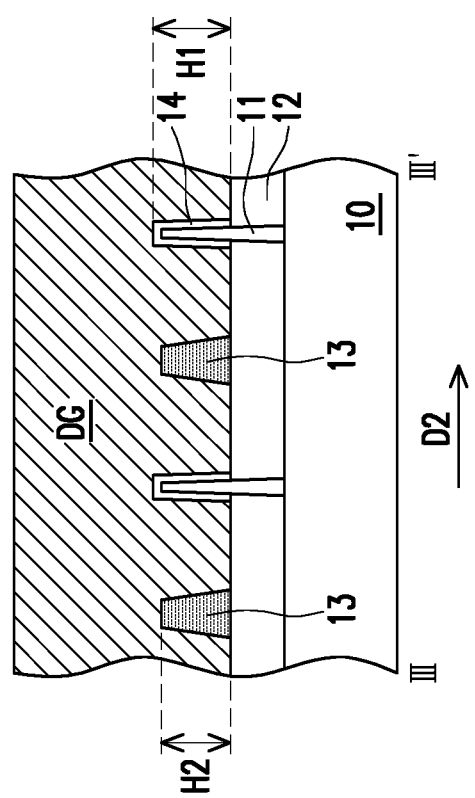

Referring to FIG. JA, FIG. 2A and FIG. 2B, a substrate 10 with multiple fins 11 thereon is provided. In some embodiments, the substrate 10 is a semiconductor substrate, such as a bulk semiconductor substrate, a silicon-on-insulator (SOI) substrate, or the like, which may be doped (e.g., with a p-type or an n-type dopant) or undoped. The substrate 10 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 10 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Depending on the requirements of design, the substrate 10 may be a P-type substrate, an N-type substrate or a combination thereof and may have doped regions therein. The doped regions may be configured for an N-type FinFET device, a P-type FinFET device or a combination thereof.

In some embodiments, the method of forming the substrate 10 with the fins 11 includes forming a mask layer on a bulk substrate, and removing a portion of the bulk substrate by performing an etching process using the mask layer as an etch mask. The etching process may be any acceptable etch process, such as a reactive ion etch (RIE), neutral beam etch (NBE), the like, or a combination thereof. The etching process may be anisotropic or isotropic. In alternative embodiments, the method of forming the substrate 10 with fins 11 includes performing a sidewall image transfer (SIT) technique. In some embodiments, the fins 11 are formed with an inclined sidewall, as shown in FIG. 2B, but the disclosure is not limited thereto. In alternative embodiments, the fins 11 may be formed with a substantially vertical sidewall. In some embodiments, the fin 11 has a height H1 ranging from 25 nm to 70 nm, such as 54 nm. The fins 11 are semiconductor strips. In some embodiments, the fins 11 are extending in a first direction D1, and arranged along a second direction D2, as shown in FIG. 1A.

Still referring to FIG. 2A and FIG. 2B, the substrate 10 further has an isolation structure 12 formed thereon. In some embodiments, the isolation structure 12 surrounds and covers lower portions (lower sidewalls) of the fins 11 and exposes upper portions (upper sidewalls and top surfaces) of the fins 11. In other words, the fins 11 protrude from the top surface of the isolation structure 12. In some embodiments, the isolation structure 12 is a shallow trench isolation (STI) structure. The isolation structure 12 includes an insulation material, which may be an oxide, such as silicon oxide, a nitride, the like, or combinations thereof.

The method of forming the isolation structure 12 includes forming an isolation material layer covering sidewalls and top surfaces of the fins 11 by chemical vapor deposition (CVD), high density plasma CVD (HDP-CVD), a flowable CVD (FCVD) (e.g., a CVD-based material deposition in a remote plasma system and post curing to make it convert to another material, such as an oxide), the like, or combinations thereof. In some embodiments, the isolation material is silicon oxide formed by a FCVD process. An anneal process may be performed once the insulation material is formed. Thereafter, a portion of the isolation material layer on the top surfaces of the fins 11 are removed by a planarization process such as chemical mechanical polishing (CMP) and/or etching back, such that top surfaces of the fins 11 are exposed. The isolation material layer is further recessed to form the isolation structure 12, such that upper sidewalls of the fins 11 are exposed. The isolation material layer may be recessed using an acceptable etching process, such as one that is selective to the isolation material. For example, a chemical oxide removal using a CERTAS® etch or an Applied Materials SICONI tool or dilute hydrofluoric (DHF) acid may be used. The top surface of the isolation structure 12 may have a flat surface as illustrated, a convex surface, a concave surface (such as dishing), or a combination thereof. It is understood that, the forming method of the fins 11 and the isolation structure 12 described above are merely for illustration, and the disclosure is not limited thereto.

In some embodiments, the fins 11 and the substrate 10 are made of the same material, such as silicon. In alternative embodiments, the fins 11 include a material different from that of the substrate 10. For example, the substrate 10 includes silicon, and the fin 11 includes silicon germanium (SiGe). In some embodiments, the substrate 10 includes silicon, and the fins 11 may include silicon and other impurities or dopants. In some embodiments, doped regions including impurities may be formed in the fins 11. For example, the fin 11 may include n-type impurities such as phosphorus, arsenic, or the like or combinations thereof for n-type FinFET device, or include p-type impurities such as boron, $BF_2$, or the like or combinations thereof for p-type FinFET device.

Still referring to FIG. 1A, FIG. 2A and FIG. 2B, in some embodiments, a plurality of hybrid fins (or referred to as dummy fins) 13 are formed on the isolation structure 12 and aside the fins 11. In some embodiments, the material of the hybrid fin 13 is different from that of the fin 11. In some embodiments, the hybrid fins 13 are made of dielectric materials (or referred to as insulating material). The dielectric materials include oxide such as silicon oxide, nitride such as silicon nitride, high-K dielectric material, or the like, or combinations thereof. The high-K material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, combinations thereof, or other suitable dielectric material. The hybrid fin 13 may be a single layer structure or a multi-layer structure. In some embodiments, the hybrid fins 13 may be formed by the following processes: after the fins 11 are formed, one or more hybrid fin material layers are formed on the isolation structure 12 and on the fins 11 by a deposition process such as CVD, HDP-CVD, FCVD, or the like, or combinations thereof. Thereafter, a removal process is performed to partially remove the hybrid fin material layer(s) to form the hybrid fins 13. In some embodiments, the hybrid fin material layers include a bottom layer conformally deposited to cover the fins 11 and a top layer blanket deposited on the bottom layer and fill up recess between two adjacent fins 11. The removal process may include performing a planarization process such as CMP to remove portions of the top and bottom layers to expose the top surface of the fins 11, and following performing an etching back process to remove another portion of the bottom layer not cover by the remaining top layer in the recess. In alternative embodiments, the removal process may be a patterning process including photolithograph process and one or more etching processes (such as dry etching).

Referring to FIG. 1A, in some embodiments, the hybrid fins 13 are strips extending along the first direction D1 and arranged along the second direction D2, which is the same as the fins 11. In some embodiments, the fins 11 and the hybrid fins 13 are arranged alternately along the second direction D2. For example, as shown in FIG. 1A, one hybrid fin 13 is disposed between two adjacent fins 11, and one fin 11 is located between two adjacent hybrid fins 13, but the disclosure is not limited thereto. In some other embodiments, two or more hybrid fins 13 may be disposed between two adjacent fins 11, and two or more fins 11 may be configured between two adjacent hybrid fins 13 according to the product design. The width W2 in the second direction D2 of the hybrid fin 13 maybe the same as or different from the width W1 in the second direction D2 of the fin 11. In some embodiments, the width W2 of the hybrid fin 13 is larger than the width W1 of the fin 11, but the disclosure is not limited thereto.

Referring to FIG. 2B, in some embodiments, the hybrid fin 13 is formed with an inclined sidewall, but the disclosure is not limited thereto. In alternative embodiments, the hybrid fin 13 may be formed with a substantially vertical sidewall. The cross-section shape of the hybrid fin 13 may be square, rectangle, trapezoid, or the like. The top surface of the hybrid fin 13 may be higher than, coplanar with or lower than the top surface of the fin 11. In some embodiments, the hybrid fin 13 has a height H2 ranging from 25 nm to 70 nm. In some embodiments, the sum value of the height H2 and the height of the isolation structure 12 is equal to the height H1 of the fin 11, but the disclosure is not limited thereto.

Figure 4A:
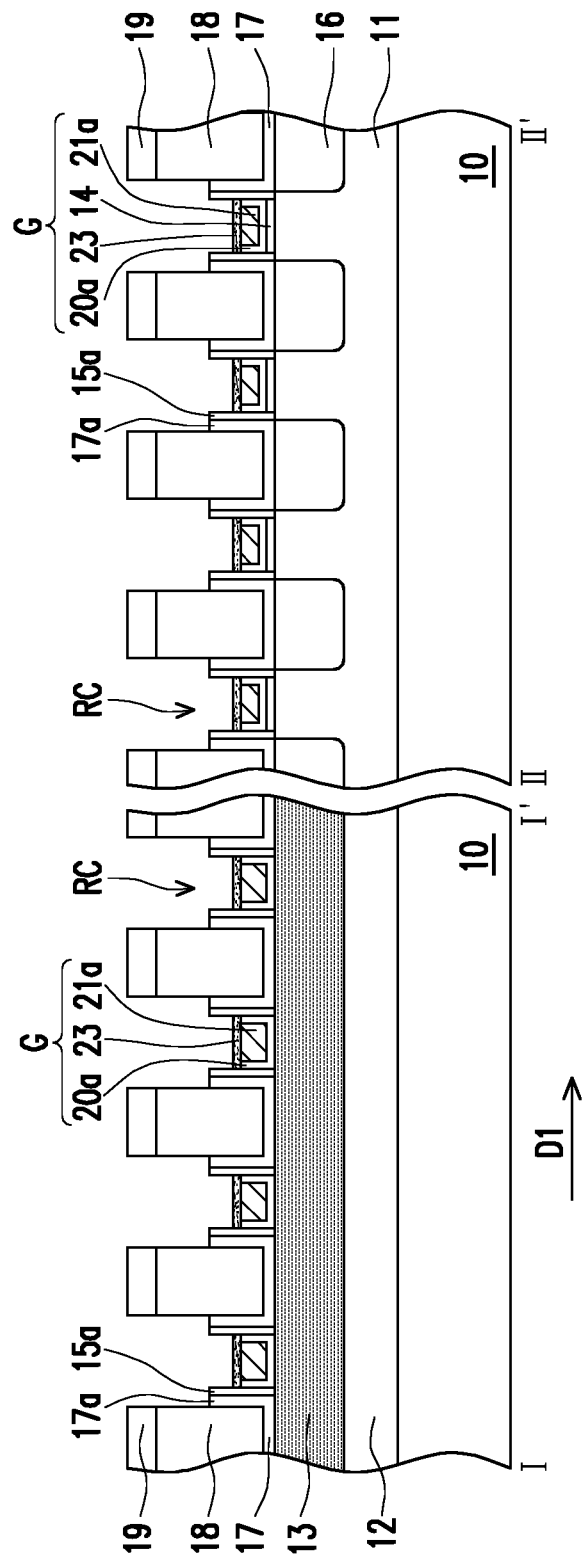
Figure 4B:
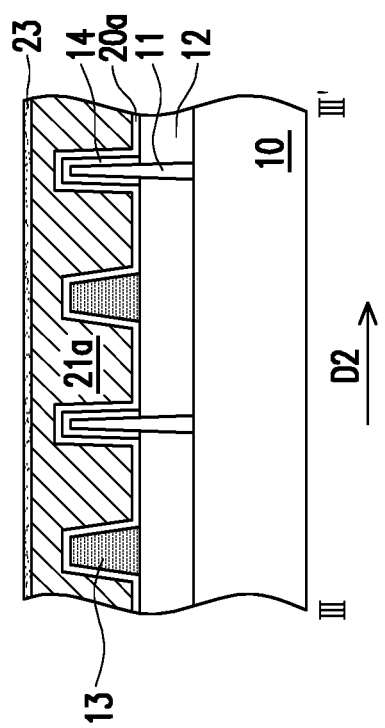

Referring to FIG. JA, FIG. 4A and FIG. 4B, in some embodiments, a plurality of gate lines G are formed on the substrate 10 across the fins 11 and the hybrid fins 13, extending in a second direction D2 different from (e.g., perpendicular to) the first direction D1. The forming method of the gate lines G may include the following processes.

Referring back to FIG. 2A and FIG. 2B, in some embodiments, after the fins 11 and the hybrid fins 13 are formed, multiple dummy gate electrodes DG are formed on the substrate 10 across the fins 11 and the hybrid fins 13. The dummy gate electrodes DG may be formed by the following processes: in some embodiments, a dummy layer is formed on the substrate 10 covering the fins 11, the hybrid fins 13 and the isolation structure 12, and is then patterned by photolithography and etching processes. In some embodiments, the dummy layer may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. In some embodiments, the dummy layer may include a silicon-containing material such as polysilicon, amorphous silicon or combinations thereof. The dummy layer may be formed by a deposition process such as physical vapor deposition (PVD), CVD, or other suitable deposition process. In some embodiments, the dummy gate electrodes DG extend in the second direction D2 different from (e.g., perpendicular to) the first direction D1.

In some embodiments, prior to forming the dummy gate electrode DG, an interfacial layer 14 is formed on the fins 11 by a thermal oxidation process, or formed on the fins 11, the hybrid fins 13 and on the isolation structure 12 by a deposition process such as CVD, ALD or other suitable process. In other words, in some embodiments, the interfacial layer 14 is formed between the dummy gate electrode DG and the corresponding fins 11. In some other embodiments, the interfacial layer 14 is formed between dummy gate electrode DG and the fins 11, between the dummy gate electrodes and the hybrid fins 13, and between the dummy gate electrodes and the isolation structure 12 (not shown). The interfacial layer 14 includes silicon oxide, silicon nitride, silicon oxynitride or combinations thereof. In some embodiments, a dummy gate dielectric layer (not shown) is further formed between the interfacial layer 14 and the dummy gate electrode DG, the dummy gate dielectric layer may include silicon oxide, silicon nitride, silicon oxynitride or the like, and formed by CVD, ALD, or other suitable process known in the art.

Thereafter, spacers 15 are formed aside the dummy gate electrodes DG. The spacers 15 are extending in the second direction D2 and respectively formed on the sidewalls of the dummy gate electrodes DG. The spacer 15 may be a single layer structure or a multi-layer structure. In some embodiments, the spacers 15 may be formed by the following processes: a spacer material layer is formed on the substrate 10 covering the dummy gate electrodes DG, and an etching process such as an anisotropic etching process is performed to remove a portion of the spacer material layer. In some embodiments, the spacer material layer includes $SiO_2$, SiN, SiCN, SiOCN, SiOR (wherein R is an alkyl group such as $CH_3$, $C_2H_5$ or $C_3H_7$), SiC, SiOC, SiON, combinations thereof or the like, and may be formed by a suitable deposition process such as CVD, ALD or the like.

Afterwards, multiple strained layers 16 are formed in the fins 11 on opposite sides of the dummy gate electrodes DG. The strained layers 16 may be formed by-epitaxial growing process such as selective epitaxial growing process. In some embodiments, recesses are formed in the fins 11, and the strained layers 16 are formed by selectively growing epitaxy layers from the recesses. In some embodiments, the top surfaces of the stained layers 16 are substantially coplanar with the top surface of the fin 11, but the disclosure is not limited thereto. In some other embodiments, the strained layers 16 are formed within the recesses and may extend upwardly along the sidewalls of the corresponding spacers 15 (not shown), and thus have top surfaces higher than the top surface of the fin 11. In some embodiments, the strained layers 16 include silicon germanium (SiGe) for a P-type FinFET device. In alternative embodiments, the strained layers 16 include silicon carbon (SiC), silicon phosphate (SiP), SiCP or a SiC/SiP multi-layer structure for an N-type FinFET device. In some embodiments, the strained layers 16 may be optionally implanted with an N-type dopant or a P-type dopant as needed. Following the formation of the strained layers 16, silicide layers (not shown) may be formed on the strained layers 16 by a self-align silicide (salicide) process.

Still referring to FIG. 2A and FIG. 2B, an interlayer dielectric layer (ILD) 18 is formed aside or around the dummy gate electrodes DG. In some embodiments, a contact etch stop layer (CESL) 17 is also formed on the spacer 15 and on the stained layer 16 prior to forming the ILD 18, and the CESL 17 includes SiN, SiC, SiON, or the like. The CESL 17 may be formed by CVD, PECVD, FCVD, ALD or the like. The ILD 18 includes a material different from that of the CESL 17. In some embodiments, the ILD 18 includes carbon-containing oxide, silicate glass, tetraethylorthosilicate (TEOS) oxide, un-doped silicate glass, or doped silicon oxide such as borophosphosilicate glass (BPSG), fluorine-doped silica glass (FSG), phosphosilicate glass (PSG), boron doped silicon glass (BSG), and/or other suitable dielectric materials. The ILD 18 may be a single layer structure or a multi-layer structure.

The ILD 18 may be formed by forming an ILD material layer on the substrate 10 until its top surface is higher than the top surfaces of the dummy gate electrodes DG, through a suitable process, such as CVD, PECVD, FCVD or the like. A planarization process such as CMP is then performed to remove the excess ILD material layer over the dummy gate electrodes DG. In some embodiments, after the planarization process is performed, a pull-back process is performed on the ILD 18. The "pull-back" process may be equivalently referred to as an "etch-back" process. A top portion of the ILD material layer may be recessed by way of the pull-back process, resulting in recessed ILD 18 which has a top surface lower than the top surfaces of the dummy gate electrodes DG. In some embodiments, the pull-back process may include a dry etching process, a wet etching process, and/or combinations thereof. The recessed ILD 18 may have a planar, concave or convex top surface.

In some embodiments, a helmet 19 is then formed on the ILD 18 for protecting the ILD 18 and underlying devices in the subsequent processes. The helmet 19 may also be referred to as a hard mask layer. The helmet 19 may have a high etching selectivity relative to the ILD 18. The material of the helmet 19 is different from that of the ILD 18. In some embodiments, the helmet 19 includes a dielectric material such as low-k material or a high-k material, or the like. The low-k material may have a dielectric constant lower than 7 and may include SiN, SiCN, SiOC, SiOCN or combinations thereof. The high-k material has a dielectric constant greater than about 7 or 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, HfAlOx, HfSiOx, combinations thereof, or a suitable material. The helmet 19 may be formed by forming a helmet material layer through a deposition process such as CVD, PECVD, FCVD, ALD or the like, thereafter, a planarization process such as CMP or an etching back process is performed to remove the helmet material layer over the dummy gate electrode DG. In some embodiments, the top surface of the helmet 19 is substantially coplanar with the top surfaces of the dummy gate electrodes DG, the spacers 15 and the CESLs 17. In some embodiments, the cross-sectional view of the helmet is square, rectangle, or the like. The profile of the bottom surface of the helmet 19 may be planar, and the profile of the top surface of the ILD 18 is also planar, but the disclosure is not limited thereto. In some other embodiments, as shown in the enlarged view of FIG. 2A, the cross-sectional view of the helmet 19 may be semi-elliptical, semi-circular or the like. The profile of the bottom surface of the helmet 19 is arced, and convex toward the top surface of the substrate 10. The top surface of the ILD 18 is also arced and concavely recessed toward the top surface of the substrate 10. In other words, the ILD 18 includes two side portions at a higher level than a middle portion, and a bottom of the helmet 19 is laterally located between the side portions of the ILD 18.

Figure 3A:
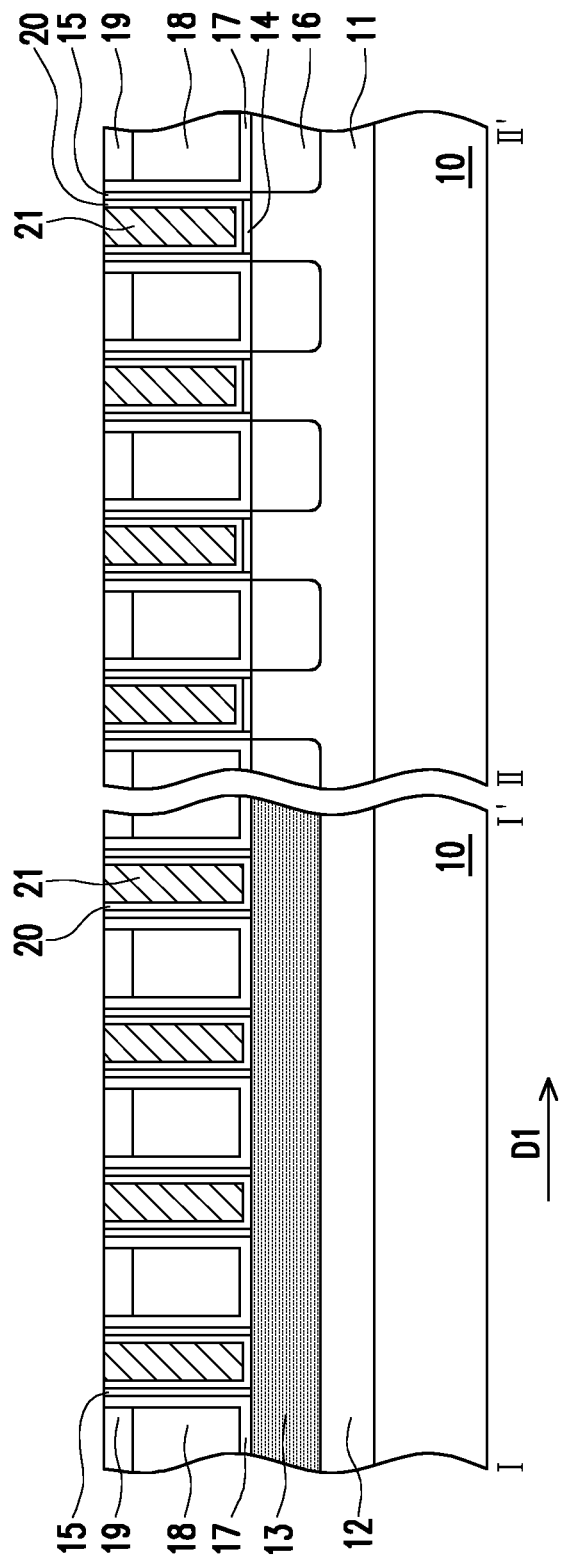
Figure 3B:
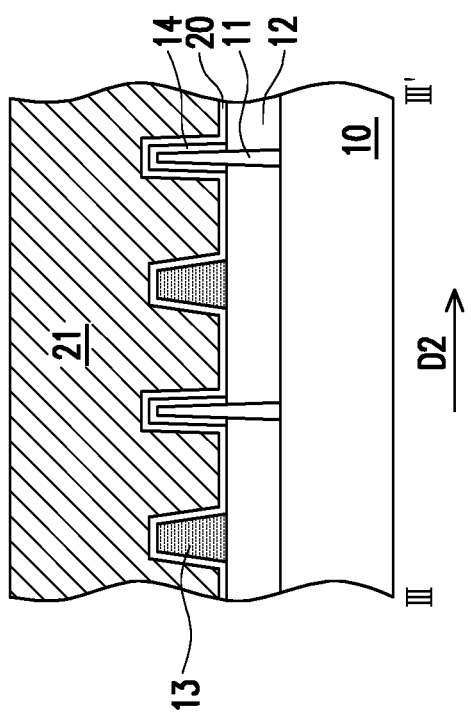

Referring to FIG. 2A and FIG. 2B to FIG. 3A and FIG. 3B, a gate replacement process is then performed to replace the dummy gate electrodes DG with metal gate electrodes 21. In some embodiments, the dummy gate electrodes DG are removed to form gate trenches in the dielectric layer 18. Thereafter, a gate dielectric layer 20 is formed extending along the surface of the gate trenches, and the metal gate electrodes 21 are filled in the gate trenches. In some embodiments, the gate dielectric layer 20 surrounds the sidewalls and bottom of the metal gate electrodes 21 and on the tops and sidewalls of the fins 11 and the hybrid fins 13. In some embodiments, the interfacial layer 14 is remained, and located between the gate dielectric layer 20 and the fins 11, as shown in FIG. 3A and FIG. 3B, but the disclosure is not limited thereto. In some other embodiments, the interfacial layer 14 may be removed along with the dummy gate electrodes DG, resulting in the gate dielectric layer 20 contacting with the fins 11 (not shown).

In some embodiments, the gate dielectric layer 20 includes a high-k material having a dielectric constant greater than about 7 or 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, combinations thereof, or a suitable material. In alternative embodiments, the gate dielectric layer 20 may optionally include a silicate such as HfSiO, LaSiO, AlSiO, combinations thereof, or a suitable material. The gate dielectric layer 20 may have a high etching selectivity relative to the hybrid fins 13. The material of the gate dielectric layer 20 may be different from the material of the hybrid fins 13 underlying thereof. In some embodiments, the metal gate electrode 21 includes a work function metal layer and a metal fill layer on the work function metal layer. The work functional metal layer is configured to tune a work function of its corresponding FinFET to achieve a desired threshold voltage Vt. The work function metal layer maybe an N-type work function metal layer or a P-type work function metal layer. In some embodiments, the P-type work function metal layer includes a metal with a sufficiently large effective work function and may comprise one or more of the following: TiN, WN, TaN, conductive metal oxide, and/or a suitable material, or combinations thereof. In alternative embodiments, the N-type work function metal layer includes a metal with sufficiently low effective work function and may comprise one or more of the following: tantalum (Ta), titanium aluminide (TiAl), titanium aluminum nitride (TiAlN), tantalum carbide (TaC), tantalum carbide nitride (TaCN), tantalum silicon nitride (TaSiN), titanium silicon nitride (TiSiN), other suitable metals, suitable conductive metal oxide, or combinations thereof. The metal fill layer includes copper, aluminum, tungsten, cobalt (Co), or a suitable material. In some embodiments, the metal gate electrode 21 may further include a liner layer, an interface layer, a seed layer, an adhesion layer, a barrier layer, combinations thereof or the like.

The metal gate electrodes 21 are extending along the second direction D2 across the fins 11 and the hybrid fins 13. In some embodiments, the top surfaces of the metal gate electrodes 21, the gate dielectric layer 20, the spacer 15, the CESL 17 and the helmet 19 are substantially coplanar with each other.

Referring to FIG. 3A and FIG. 3B to FIG. 4A and FIG. 4B, in some embodiments, a removal process is performed to remove portions of the metal gate electrodes 21 and portions of the gate dielectric layers 20, so as to form metal gate electrodes 21a and gate dielectric layers 20a. The removal process includes one or more etching processes (such as etching back process). As such, the height of the metal gate electrodes 21 is reduced. In some embodiments, the top surfaces of the metal gate electrodes 21a are substantially coplanar with the top surfaces of the gate dielectric layers 20a and lower than the top surfaces of the helmets 19.

Thereafter, another removal process is performed to remove portions of the spacers 15 and portions of the CESL 17 by using the helmet 19 as an etching mask, such that spacers 15a and CESLs 17a with reduced height are formed. The removal process may include an etching process such as an isotropic process, an anisotropic process, or a combination thereof. In some embodiment, the top surfaces of the spacers 15a and the top surfaces of the CESLs 17 are higher than the top surfaces of the metal gate electrodes 21a and the gate dielectric layer 20a, and lower than the top surfaces of the helmets 19. In some embodiment, the top surfaces of the spacers 15a and the top surfaces of the CESLs 17 are substantially coplanar with each other, or located at different levels. The sequence of the removal processes of the metal gate electrodes 21a, the gate dielectric layer 20a, the spacers 15a and the CESL 17 described above are merely for illustration, and the disclosure is not limited thereto. In some other embodiments, the metal gate electrodes 21a and the gate dielectric layer 21a may be partially removed after the spacers 15a and the CESL 17 are partially removed.

Referring to FIG. 4A, in some embodiments, after the removal processes are performed, a recess RC is formed in the ILD 18 and the helmet 19. In some embodiments, the cross-section shape of the recess RC is T-shaped or the like.

Referring to FIG. 4A and FIG. 4B, in some embodiments, a protection layer 23 is then formed on the metal gate electrodes 21a. In some embodiments, the protection layer 23 includes substantially fluorine-free tungsten (FFW) film. The FFW film may be formed by atomic layer deposition (ALD) or CVD using one or more non-fluorine based W precursors such as, but not limited to, tungsten pentachloride ($WCl_5$), tungsten hexachloride ($WCl_6$), or a combination thereof. In some embodiments, the protection layer 23 is merely formed on the metal gate electrodes 21a to cover the top surfaces of the metal gate electrodes 21a, but the disclosure is not limited thereto. In some other embodiments, the protection layer 23 may cover the metal gate electrodes 21a and may further extend to cover the top surfaces of the gate dielectric layers 20a and contact with the spacer 15a. The sidewalls of the protection layer 23 may be aligned with the sidewalls of the metal gate electrodes 21a or the sidewalls of the gate dielectric layer 20a, and the disclosure is not limited thereto.

Referring to FIG. 1A and FIG. 4A, in some embodiments, the metal gate electrodes 21a, the gate dielectric layer 20a, the interfacial layer 14 and the protection layer 23 form the gate line (or referred to as metal gate line) G. The gate lines G are extending along the second direction D2, and arranged along the first direction D1, across the fins 11 and the hybrid fins 13. It is noted that, for the sake of brevity, merely metal gate electrodes 21a are shown to represent the gate line G in FIG. 1A.

Figure 1B:
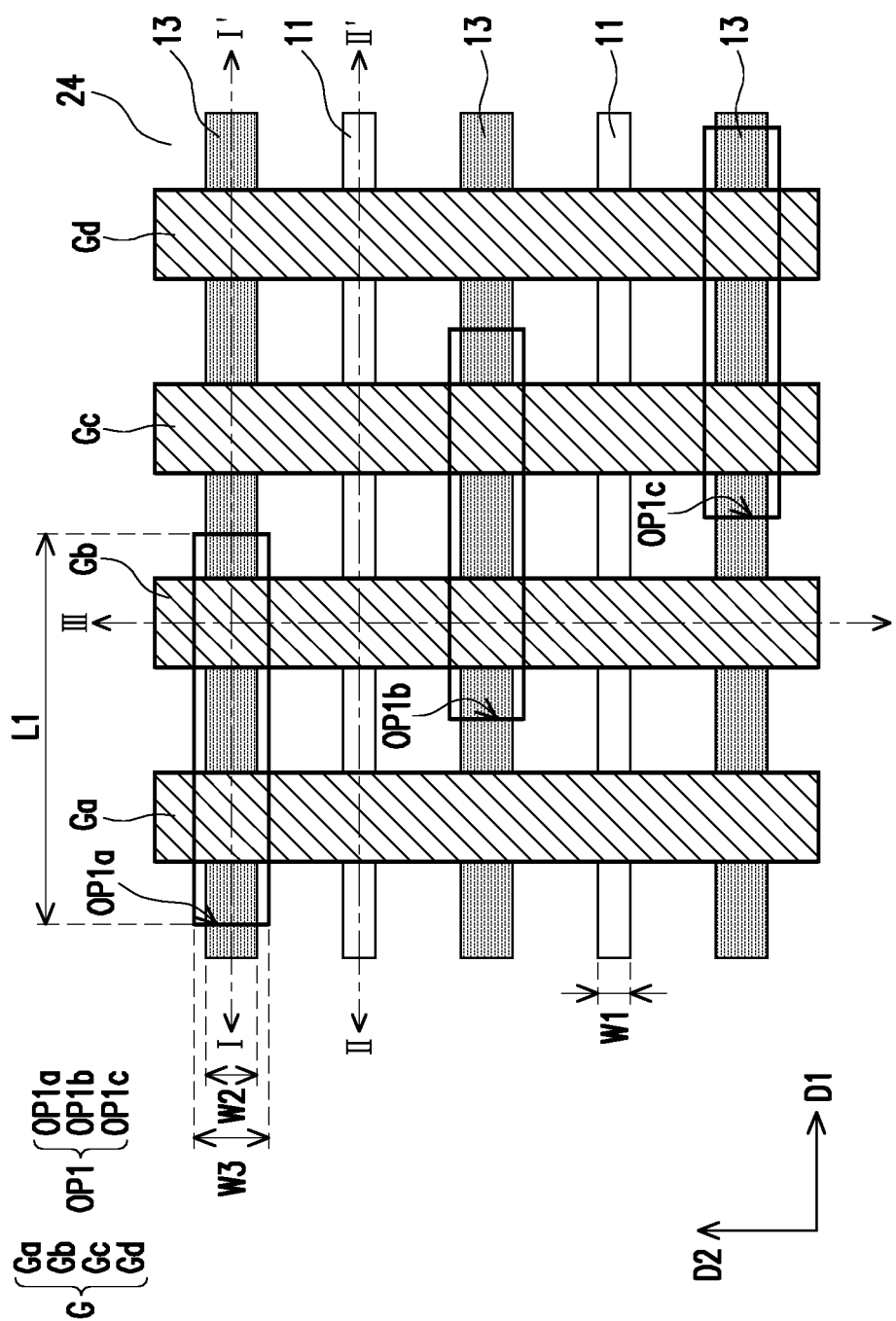
Figure 1C:
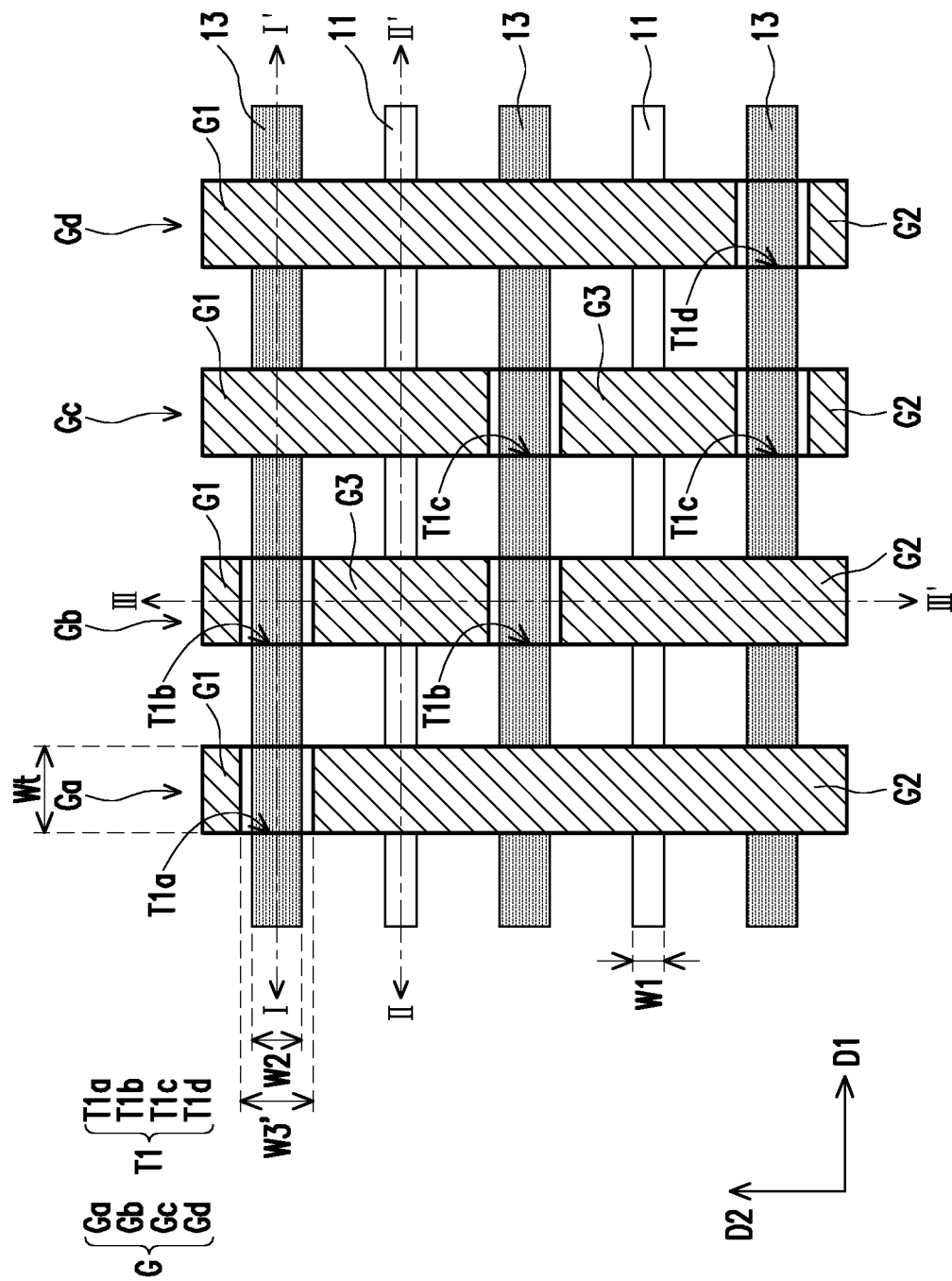
Figure 6A:
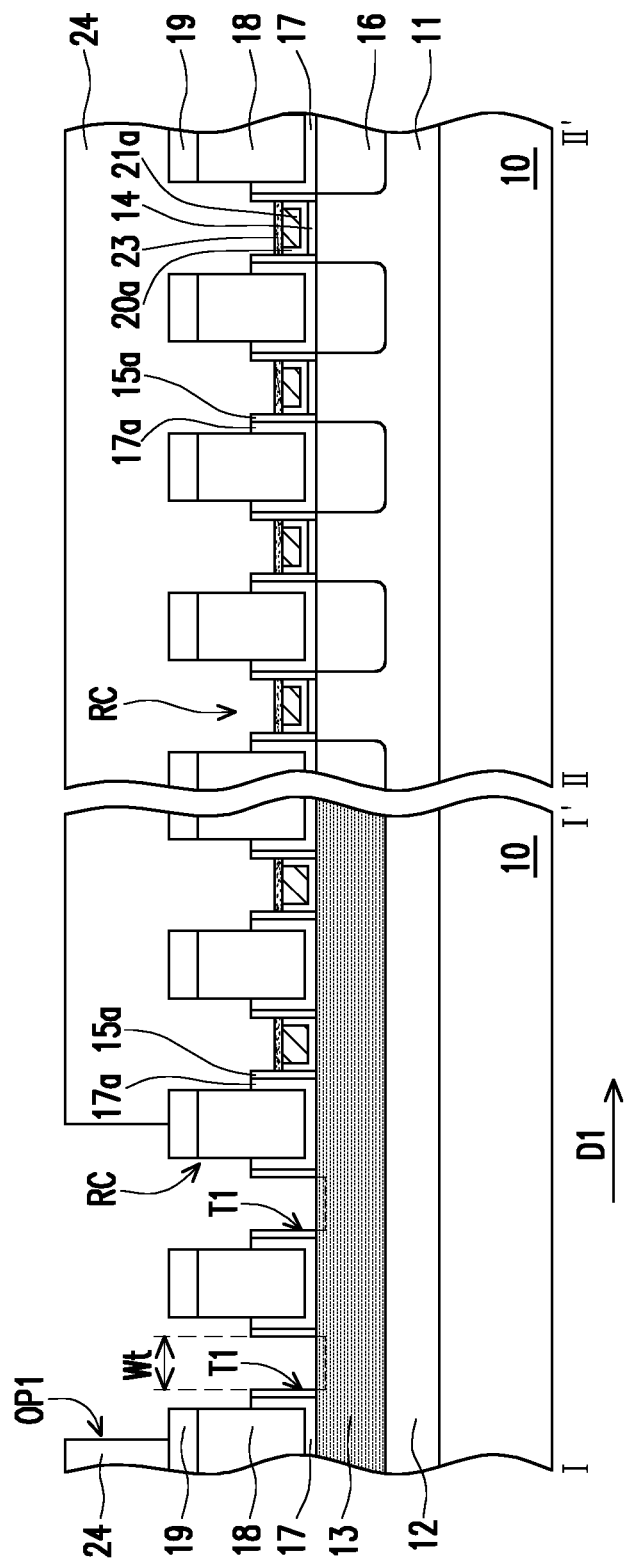
Figure 6B:
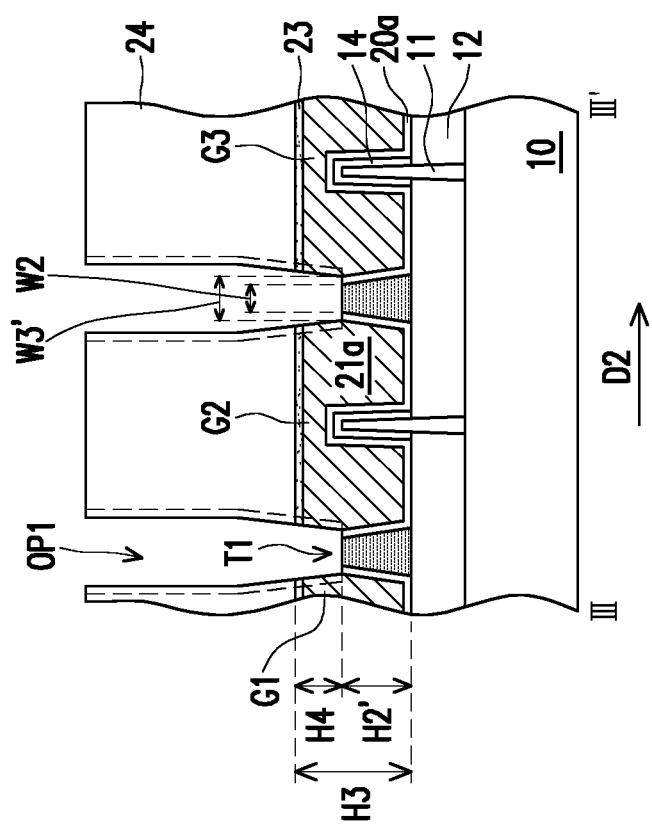

Referring to FIG. 1C, FIG. 6A and FIG. 6B, a cutting process is performed to cut off or disconnect one or more of the gate lines G. The cutting process may be performed by removing a portion the gate line G, so as to form at least one trench T1 in the dielectric layer 18 and in the gate line G. In some embodiments, the cutting process includes photolithography and etching processes. An example of the cutting process is described as below.

Figure 5A:
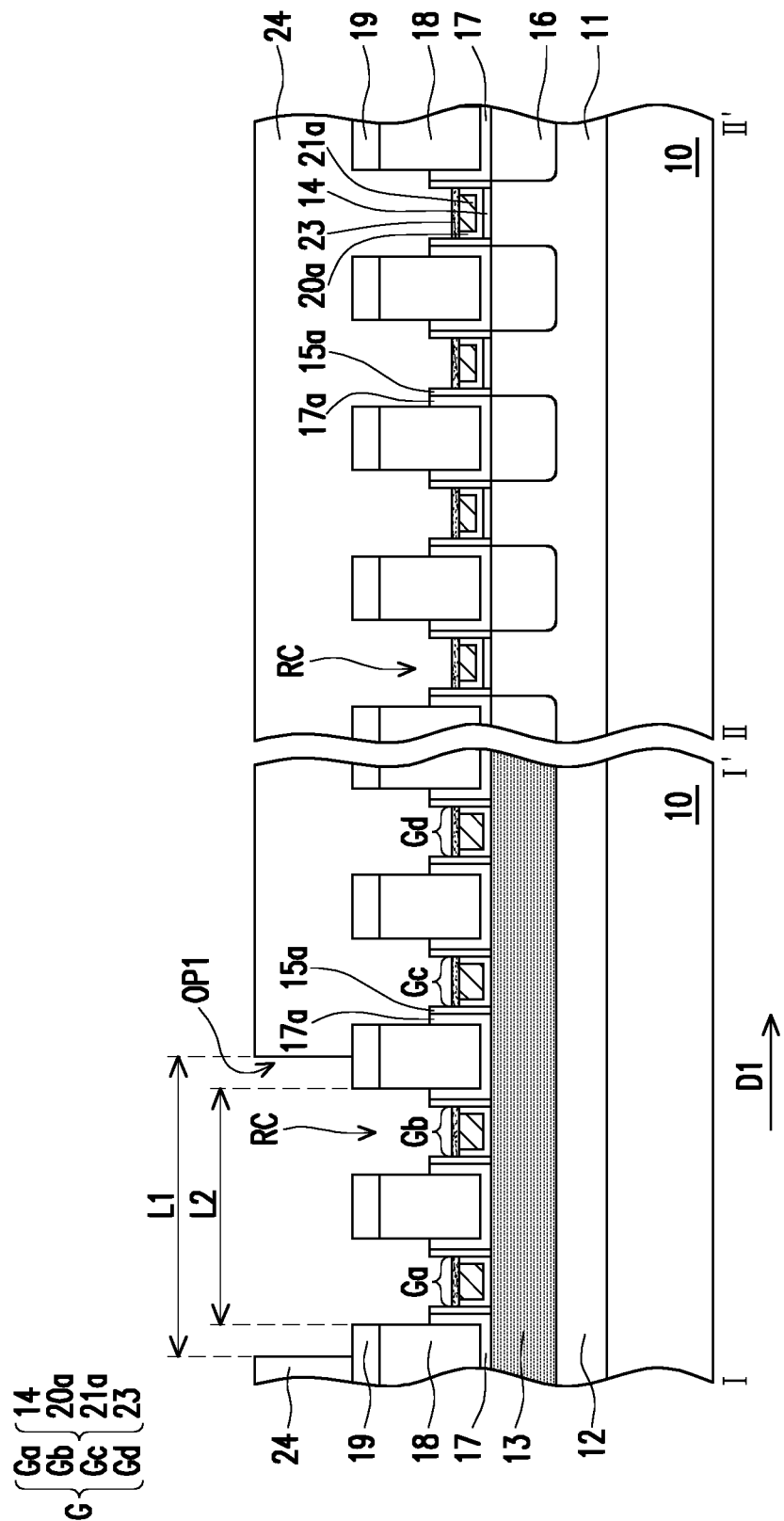
Figure 5B:
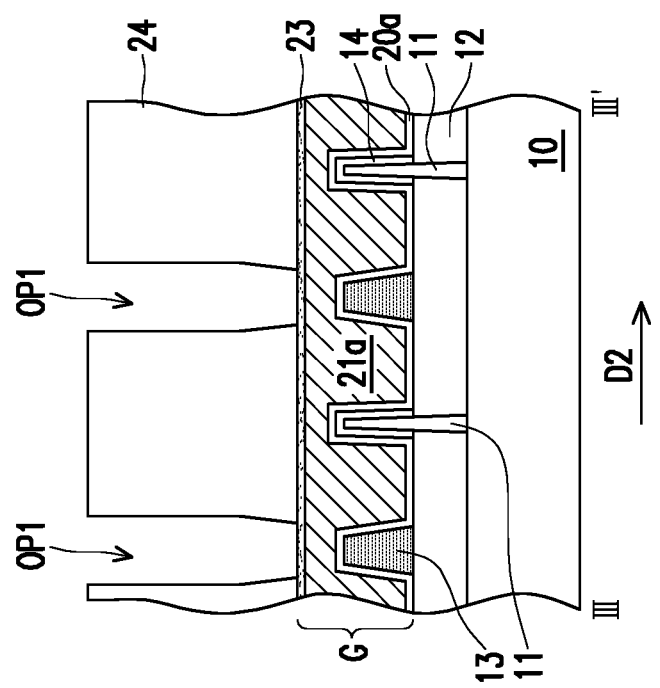

Referring to FIG. 1B, FIG. 5A and FIG. 5B, in some embodiments, a patterned mask layer 24 with one or more openings OP1 is formed over the substrate 10. The patterned mask layer 24 may be a single-layer structure or a multi-layer structure. In some embodiments, the patterned mask layer includes patterned photoresist, and may be formed by a photolithography process. For example, a photoresist layer is formed over the substrate 10, and then exposure and development process are performed on the photoresist layer. However, the disclosure is not limited thereto. In some embodiments in which the patterned mask layer 24 is a multi-layer structure, the forming method thereof will be described as below with reference to FIGS. 17A to 17D.

Figure 17A:
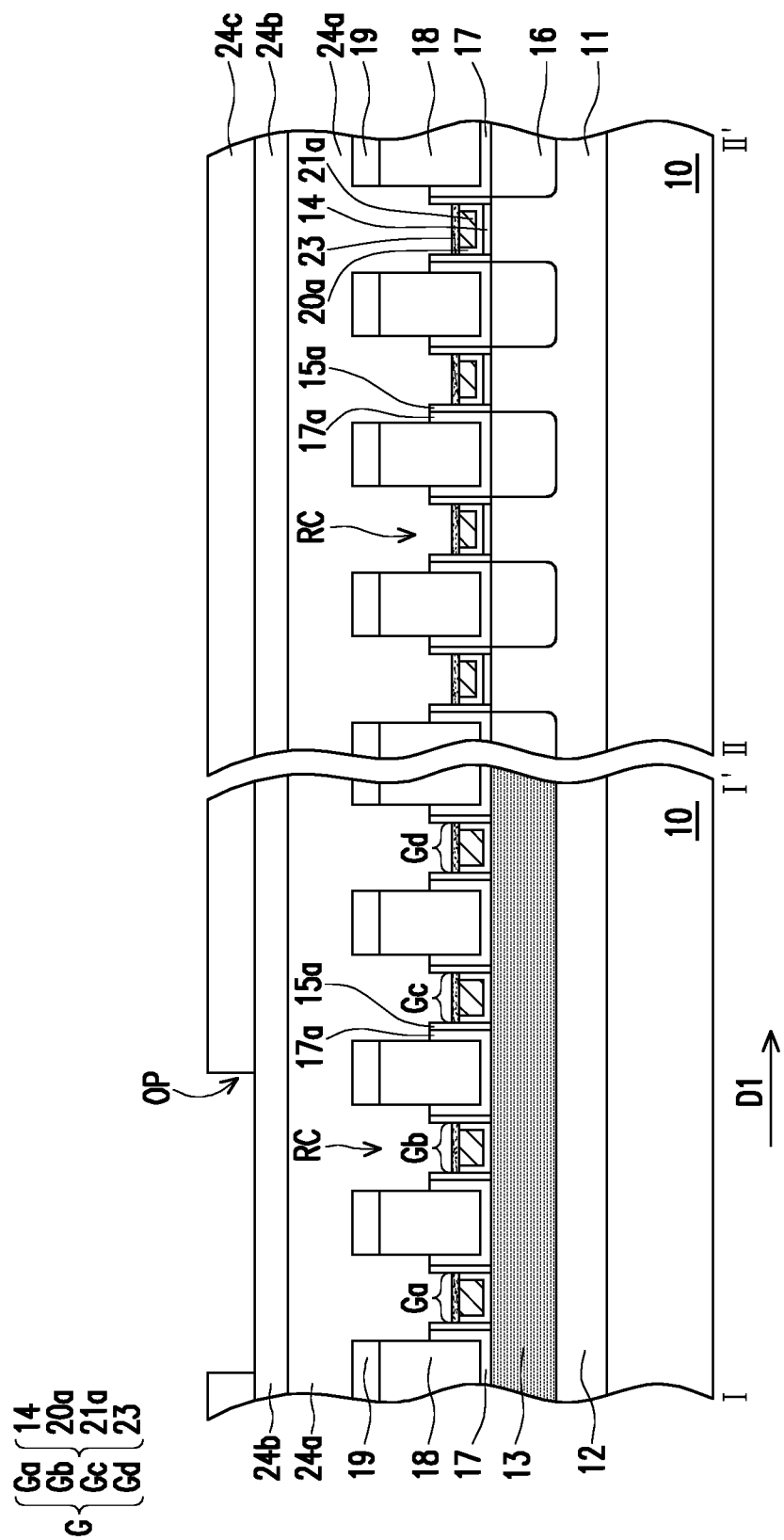
FIG. 17A to FIG. 17E are schematic cross-sectional view of a method of forming a patterned mask layer according to some embodiments of the disclosure.

Referring to FIG. 17A, in some embodiments, the patterned mask layer 24 is formed from a tri-layer structure including a bottom layer 24a, a middle layer 24b and an upper layer 24c. The bottom layer 24a may be a bottom anti-reflective coating (BARC) layer. In some embodiments, the middle layer 24b is a hard mask layer such as a silicon containing hard-mask layer, or the like. In some embodiments, the middle layer 24b may be formed of or include an inorganic material, which may be a nitride (such as silicon nitride), an oxynitride (such as silicon oxynitride), an oxide (such as silicon oxide), or the like. The upper layer 24c may be formed of a photosensitive material, such as a photoresist, which may comprise organic materials. The middle layer 24b may have a high etching selectivity relative to the upper layer 24c and the bottom layer 24a. The various layers of the bottom layer 24a to upper layer 24c may be blanket deposited sequentially using, for example, spin-on coating processes. Other suitable deposition process may be used, such as CVD, ALD, PVD, or the like. Although a tri-layer structure is discussed, the disclosure is not limited thereto.

In some embodiments, the bottom layer 24a is formed on the gate lines G, the spacers 15a, the CESLs 17a, and the helmet 19. In other words, the bottom layer 24a fills into the recesses RC, and the top surface of the bottom layer 24a may be located at a higher level than the top surface of the helmet 19. The top surfaces of the protection layer 23, the spacers 15, the CESLs 17, and the helmets 19, portions of sidewalls of the spacers 15, the ILD 18 and the helmets 19 are covered and in physical contact with the bottom layer 24. The middle layer 24b and the upper layer 24c are sequentially formed on the bottom layer 24a.

In some embodiments, the upper layer 24c is patterned to have an opening OP (or referred to as opening pattern) therein. The location of the opening OP is corresponding to the subsequently formed opening OP1 of the patterned mask layer 24 (FIG. 5A). The opening OP exposes a portion of the top surface of the middle layer 24b. The patterning method may be photolithography including exposure and development processes.

Figure 17B:
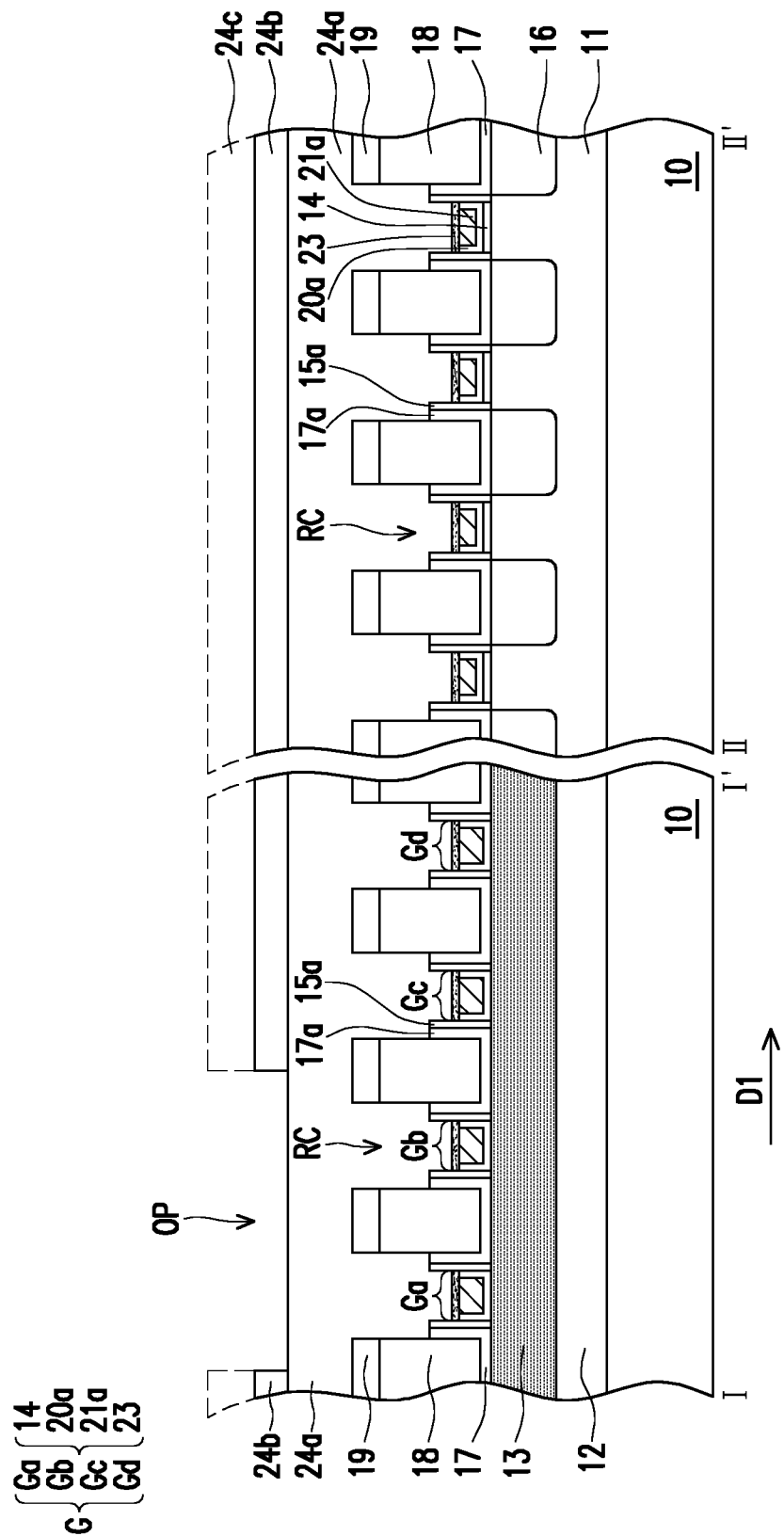

Referring to FIG. 17A and FIG. 17B, the opening pattern OP of the upper layer 116 is sequentially transferred to the middle layer 24b and exposes the top surface of the bottom layer 24a, through etching the middle layer 24b with the upper layer 24c as an etching mask. In some embodiments, during the etching process of the middle layer 24b, the upper layer 24c may be partially or completely consumed.

Figure 17C:
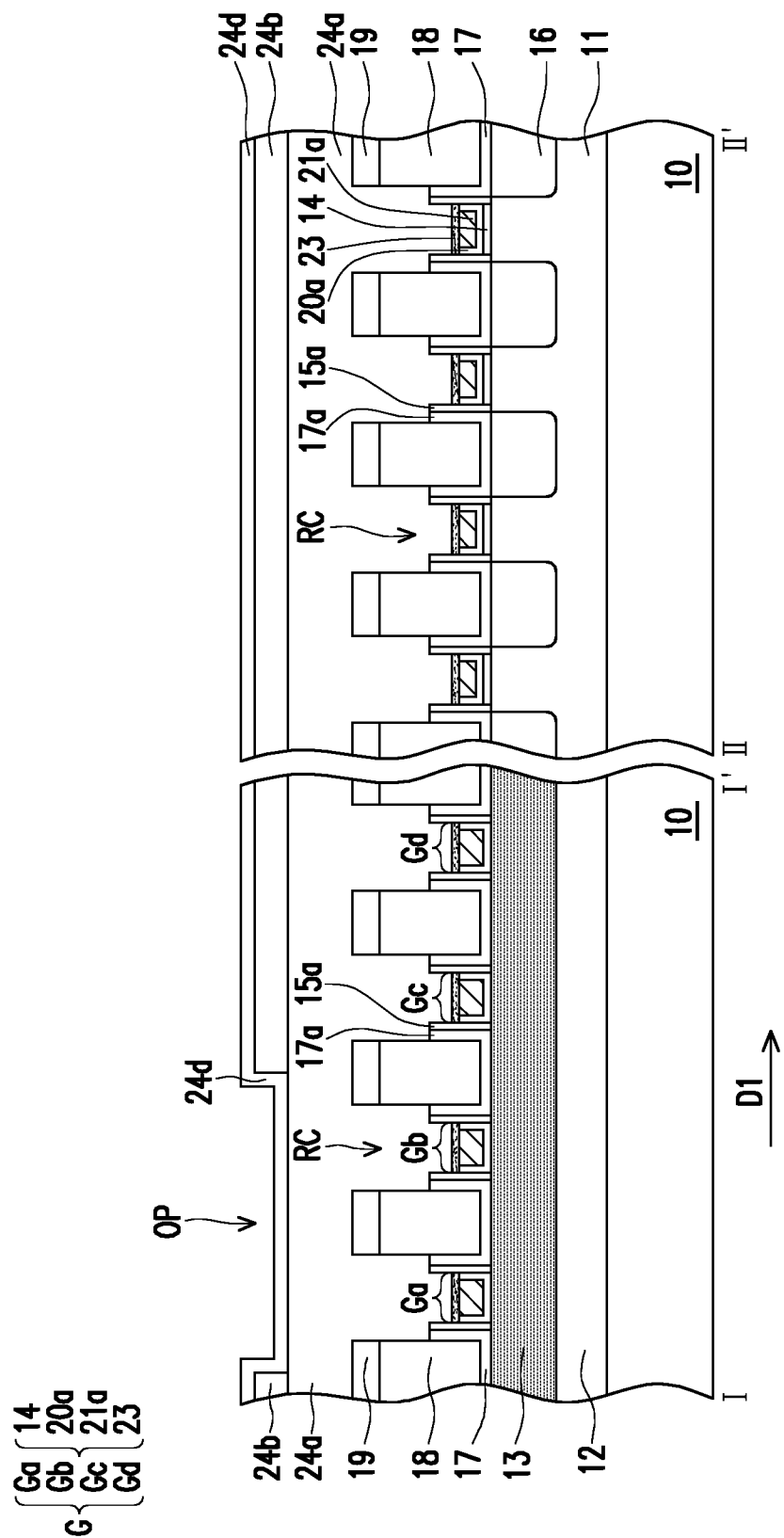

Referring to FIG. 17B and FIG. 17C, in some embodiments, a layer 24d is then formed on the middle layer 24b and the bottom layer 24a by spin coating, CVD, ALD or other suitable processes. In some embodiments, the layer 24c is an oxide layer such as a Low-Temperature (LT) oxide layer, which is deposited at a low temperature, for example, lower than about 100° C., or ranging from 50° C. to 200° C.

Figure 17D:
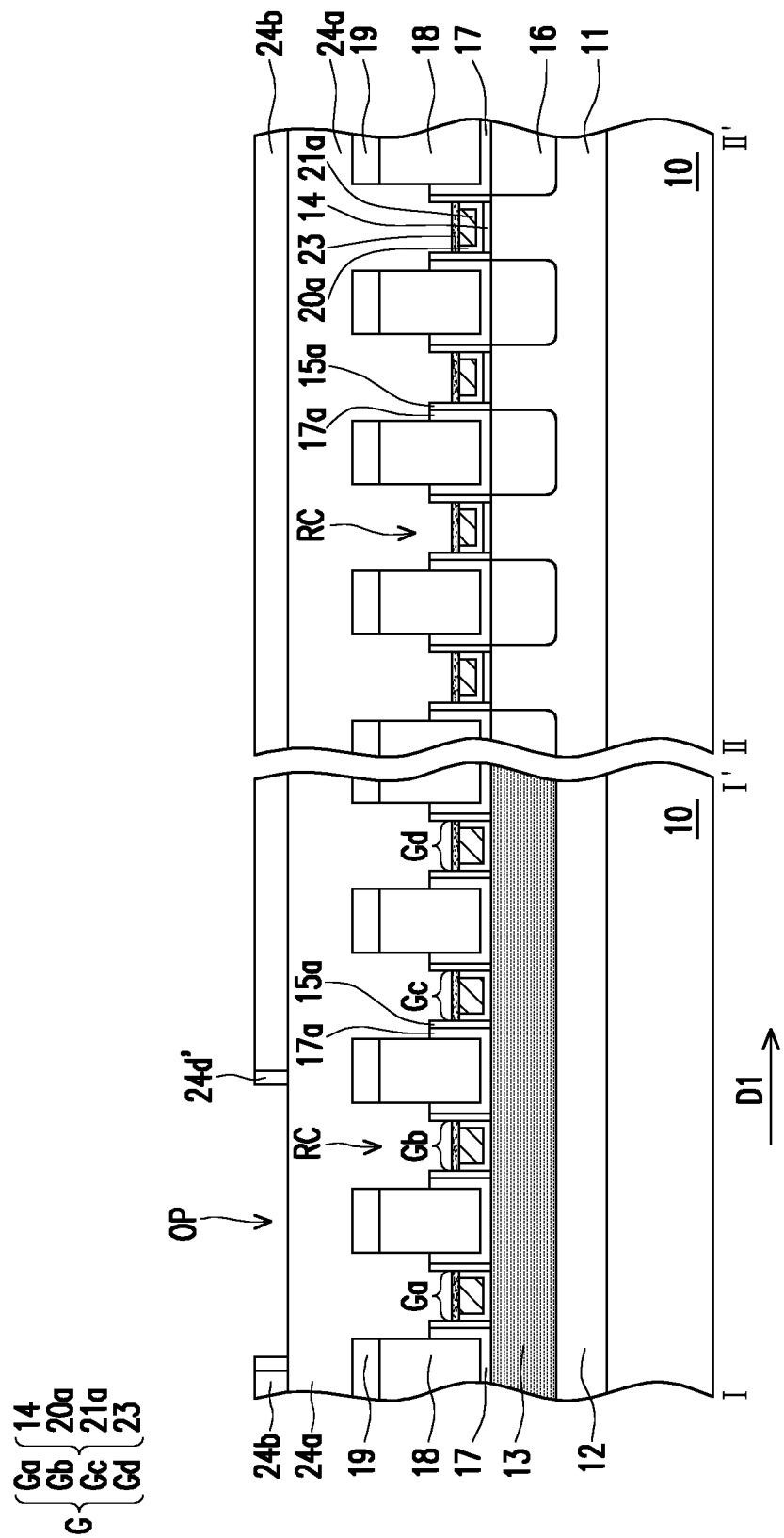

Referring to FIG. 17C to FIG. 17D, an etching process such as an anisotropic process is performed on the layer 24d, such that the horizontal portions of the layer 24d on the top surfaces of the middle layer 24b and the bottom layer 24a are removed. As a result, a layer 24d' is formed on the bottom layer 24a and on sidewalls of the middle layer 24b. In other words, the layer 24d' is formed along the sidewalls of the opening OP. In some embodiments, the layer 24d' is formed to keep and maintain the profile of the opening pattern OP, and serve as a hard mask in the subsequently etching processes.

Figure 17E:
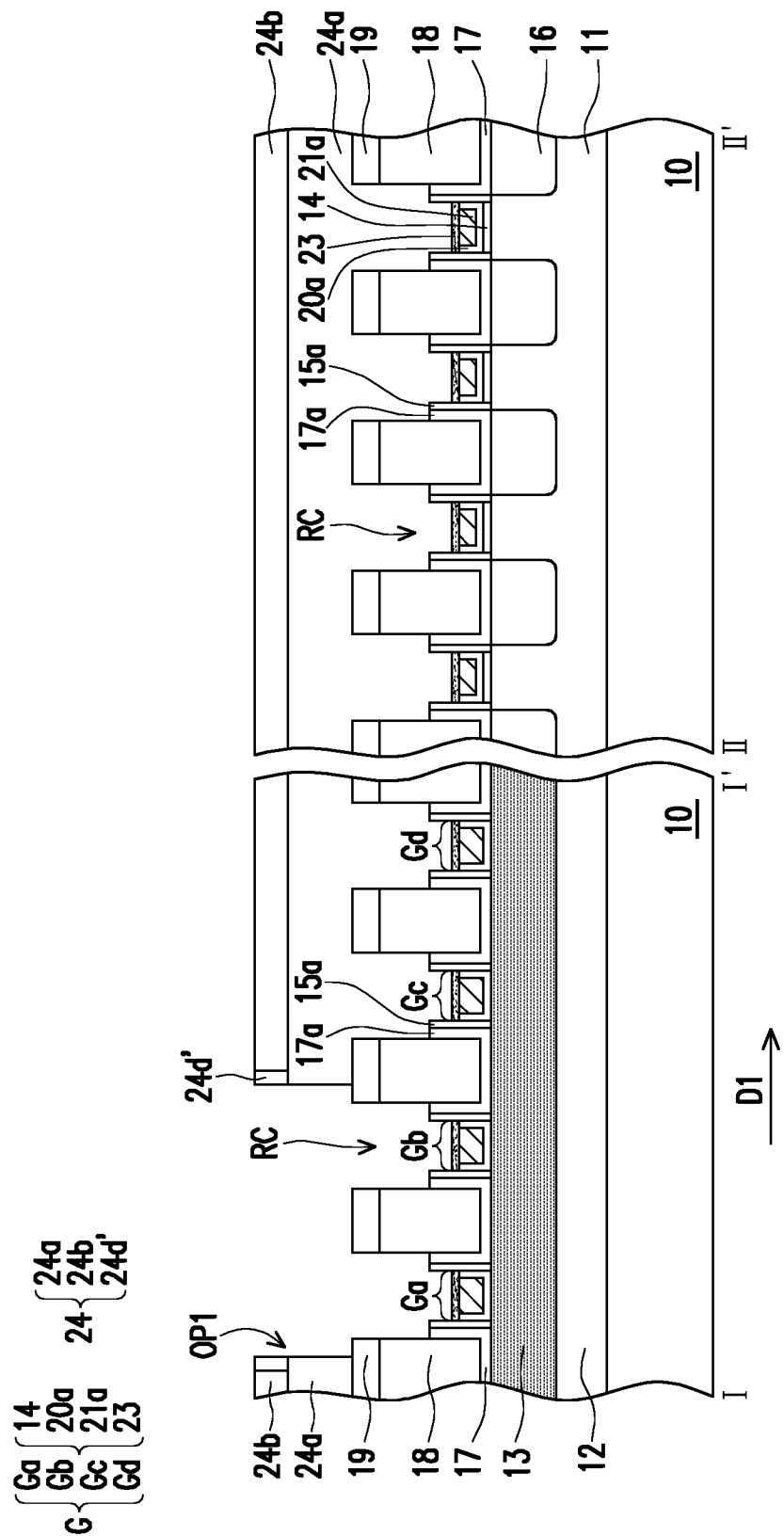

Referring to FIG. 17D and FIG. 17E, the bottom layer 24a is patterned by an etching process with the layer 24d' and the middle layer 24b as an etching mask, in some embodiments, a portion of the bottom layer 24a on the helmet 19 and in the recess RC are removed, so as to form the patterned mask layer 24 having openings OP1. In some embodiments, the patterned mask layer 24 includes the bottom layer 24a, the middle layer 24b and the layer 24d'. The bottom layer 24a is located on and in contact with the gate lines G, the spacers 15a, the CESLs 17a, the dielectric layer 18, and the helmets 19. The middle layer 24b is located on the bottom layer 24a, the layer 24d' is located on the bottom layer 24a and on sidewalls of the middle layer 24b. In some embodiments, the sidewalls of the bottom layer 24a and the sidewalls of the layer 24d' are exposed in the opening OP1, and may be aligned with each other, but the disclosure is not limited thereto.

In the embodiments described above, the layer 24d is formed before the opening pattern OP is transferred to the bottom layer 24a, but the disclosure is not limited thereto. In some other embodiments, the layer 24d may be formed after the opening pattern OP is transferred to the bottom layer 24a, and the layer 24d' may be formed on sidewalls of the bottom layer 24a and on sidewalls of the middle layer 24b (not shown). The structure and the forming method of the patterned mask layer 24 described above are merely for illustration, and the disclosure is not limited thereto. Further, for the sake of brevity, the structure of the patterned mask layer 24 are not specifically shown in FIG. 5A to FIG. 6B.

Referring back to FIG. 1B, in some embodiments, the patterned mask layer 24 includes the plurality of openings OP1 formed over the hybrid fins 13. In some embodiments, the width W3 of the opening OP1 along the second direction D2 is larger than the width W2 of the hybrid fin 13, but the disclosure is not limited thereto. The openings OP1 are extending along the first direction D1, and across one or more gate lines G. In some embodiments, the openings OP1 are staggered, and partially overlapped with each other in the second direction D2, but the disclosure is not limited thereto. In some embodiments, each opening OP1 may run across two gate lines G. For example, the patterned mask layer 24 includes openings OP1a, OP1b and OP1c, the gate lines G includes gate lines Ga, Gb, Gc and Gd. The opening OP1a run across the gate lines Ga and Gb. The opening OP1b run across the gate lines Gb and Gc. The opening OP1c run across the gate lines Gc and Gd. However, the disclosure is not limited thereto. In some embodiments, each opening OP1 may run across one or more than two gate lines G, the gate line G may be exposed by one or more than two openings OP1, some of the gate lines G may be not exposed by the opening OP1, depending on the product design.

Referring to FIG. 1B, FIG. 5A and FIG. 5B, the opening OP1 of the patterned mask layer 24 is in spatial communication with the recess RC. In some embodiments in which the opening OP1 run across two gate lines G, the opening OP1 has a length L1 larger than the space (or referred to as distance) L2 between the two helmets 19 on outer sides of the two gate lines G (such as Ga and Gb). In other words, the opening OP1 exposes portions of the protection layer 23 of the two gate lines G (such as Ga and Gb), portions of top surfaces of the helmets 19 on outer sides of the exposed two gate lines G (such as Ga and Gb), the top surface of the helmet 19 between (that is, on inner sides of) the exposed two gate lines G (such as Ga and Gb), the CESLs 17a and the spacers 15a aside the exposed two gate lines G.

Referring to FIG. 1C, FIG. 6A and FIG. 6B, portions of the gate lines G exposed by the openings OP1 are removed to cut off the gate lines G. Specifically, portions of the protection layer 23, portions of the metal gate electrodes 21a, portions of the gate dielectric layers 20a, and portions of the interfacial layer 14 are removed, and portions of the hybrid fins 13 are exposed. In some embodiments, the gate lines G are cut by one or more etching processes with the patterned mask layer 24, the helmet 19, the CESL 17a, and the spacer 15a as the etching mask. In some embodiments, the etching process includes dry etching, wet etching, or combinations thereof. In some embodiment, the cutting process may further include performing an over etch process, and portions of the hybrid fins 13 may be removed, so as to ensure (the gate dielectric layer 20a of) the exposed gate lines G is completely removed. Upon the over etch process, shown as the dotted line in FIG. 6A, the trench T1 may further extend into the hybrid fin 13, and has a bottom surface lower than the topmost surface of the hybrid fin 13, that is, the hybrid fin 13 may be recessed. Referring to FIG. 5B and FIG. 6B, the gate dielectric layer 20a on the exposed hybrid fin 13 is completely removed, so as to avoid current leakage. In some embodiment, after the cutting process is performed, a portion of the top surface of the gate dielectric layer 20a is substantially level with the top surface of the hybrid fin 13.

In other words, trenches T1 are formed in the dielectric layer 18 and in the gate lines G. In some embodiments, the trenches T1 may also be referred to as recesses. Referring to FIG. 6A, the trenches T1 are underlying portions of the recesses RC and are in spatial communication with the corresponding recesses RC. In other words, portions of the recess RC are deepened. In some embodiments, the opposite sidewalls of the trench T1 in the first direction D1 exposes a portion of the spacer 15a, the opposite sidewalls of the trench T1 in the second direction D2 exposes a portion of the metal gate electrode 21a and a portion of the protection layer 23, and the bottom of the trench T1 exposes a portion of the hybrid fin 13 and a portion of the gate dielectric layer 20a (FIG. 6B). In some embodiments, the bottom of the trench T1 further exposes a portion of the metal gate electrode 21a (shown as the dotted line in FIG. 6B).

Referring to FIG. 1C and FIG. 6A, in some embodiments, the cross section shape of the trench T1 along line I-I' may be square, rectangle, or the like. The width Wt of the trench T1 along the first direction D1 substantially equal to the width of the gate line G along the first direction D1. Referring to FIG. 1C and FIG. 6B, in some embodiments, the cross-section shape of the trench T1 along line III-III' may be trapezoid, square, rectangle, or the like. The sidewalls of the trench T1 may be substantially straight or inclined. The aspect ratio (H4/W3') of the trench T1 ranges from 0.125 to 3.75, for example. The width W3' of the trench T1 may range from 8 nm to 40 nm, for example. The height H4 of the trench T1 is less than the height H3 of the gate line G on the isolation structure 12. The height H4 may be less than 30 nm, and may range from 5 nm to 25 nm, or 5 nm to 30 nm, for example. In some embodiments, the sum of the height H2' of the hybrid fin 13 and the height H4 of the trench T1 equal to the height H3 of the gate line G. The height H2' of the hybrid fin 13 may be equal to or slightly less than the height H2 of the hybrid fin 13.

As shown in FIG. 1C and FIG. 6B, the gate line G is cut off by the trenches T1 and the hybrid fins 13 underlying thereof. In the embodiments of the disclosure, since hybrid fins 13 are formed, the amount and the height of the gate line G need to be removed to cut the gate line G is significantly reduced, and may be adjusted by adjusting the height H2 of the hybrid fin 13. As such, the gate line G is easier to be etched and cut off. In some embodiments, the width W3' (i.e. bottom width) of the trench T1 is larger than the width W2 (i.e. top width) of the hybrid fin 13, but the disclosure is not limited thereto. The width W3' of the trench T1 may be equal to or less than the width W2 of the hybrid fin 13, as long as the gate line G is cut off.

In some embodiment, some of the gate lines G may be cut into two sections disconnect to each other by one trench T1 therein, such as the outer two gate lines Ga and Gd in FIG. 1C. Specifically, the gate lines Ga and Gd are cut into two groups of gate lines (or referred to as gate line sections) G1 and G2 disconnect to each other by the trench T1a and T1d, respectively. Some of the gate lines G may be cut into three sections disconnect to each other by two trenches T1 therein, such as the middle two gate lines Gb and Gc shown in FIG. 1C and FIG. 6B. Specifically, the gate lines Gb and Gc are cut into three groups of gate lines (or referred to as gate line sections) G1, G2, and G3 by two trenches T1*b* and two trenches T1*c*, respectively. In the gate line Gb or Gc, gate line G3 is located between the two trenches T1*b* or T1*c*, and gate lines G1 and G2 are located at outer sides of the two trenches T1*b* or T1*c* in the second direction D2. It is understood that, the cutting mode herein is merely for illustration, and the disclosure is not limited thereto. The cutting mode of the gate lines G may be adjusted according to the requirement of the product design.

Figure 1D:
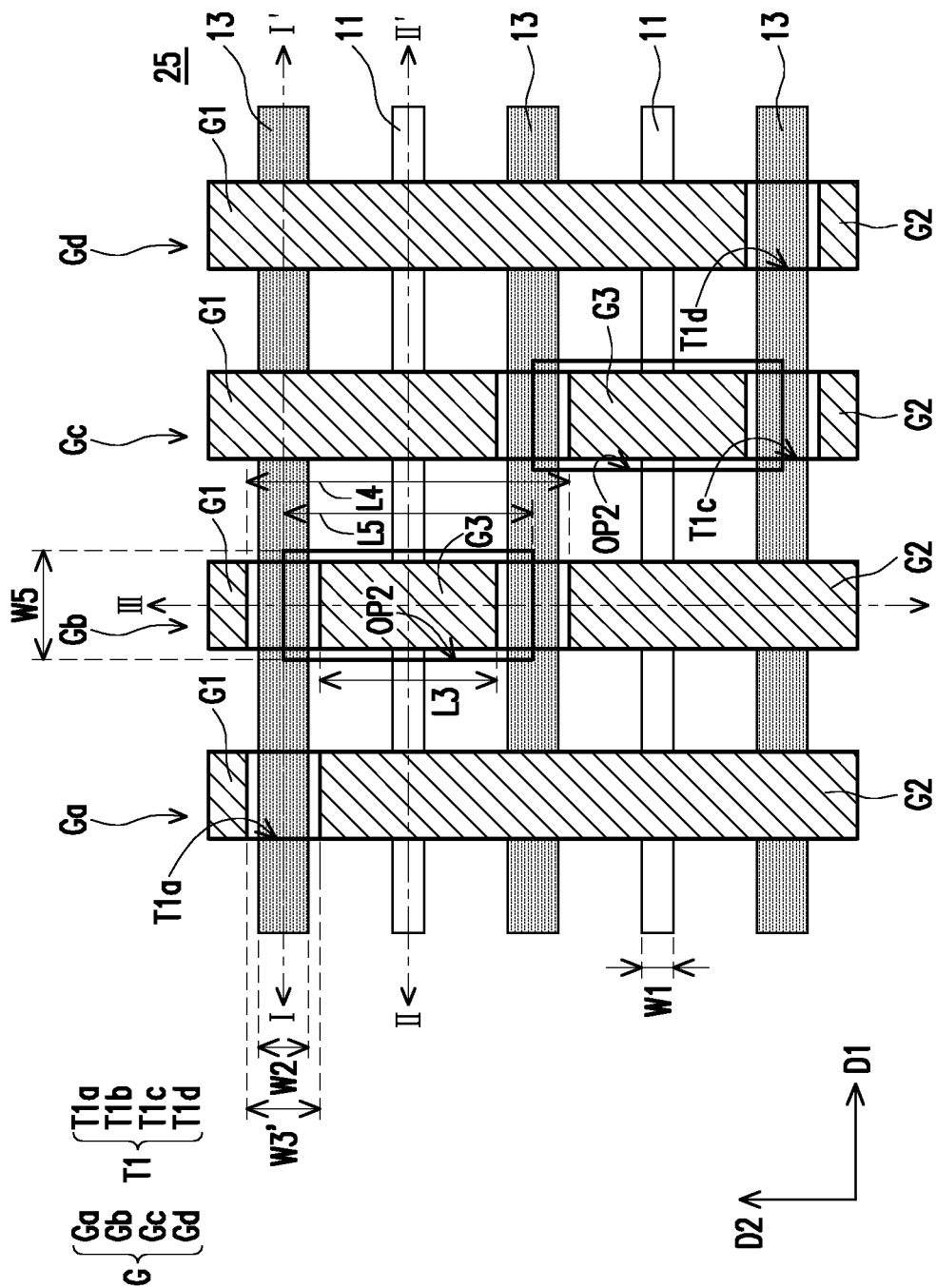
Figure 7A:
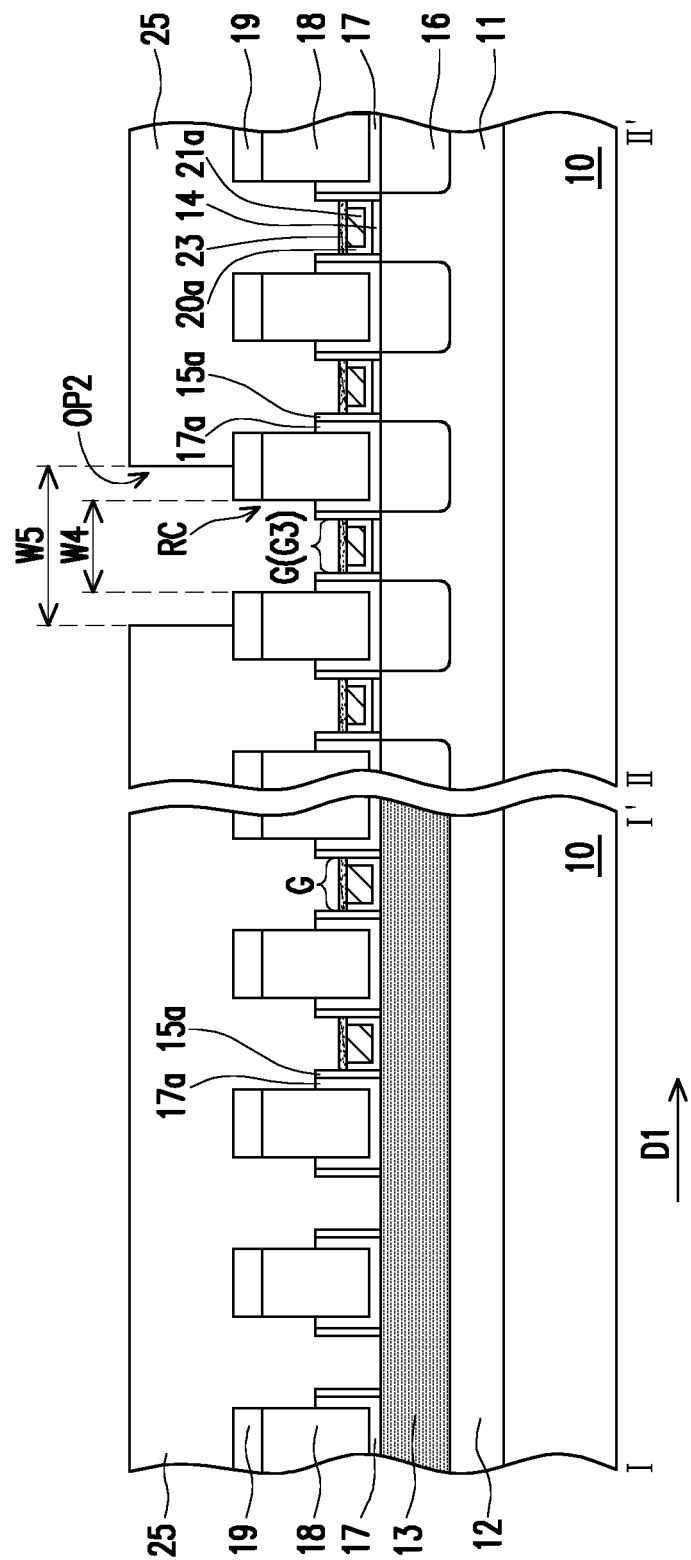
Figure 7B:
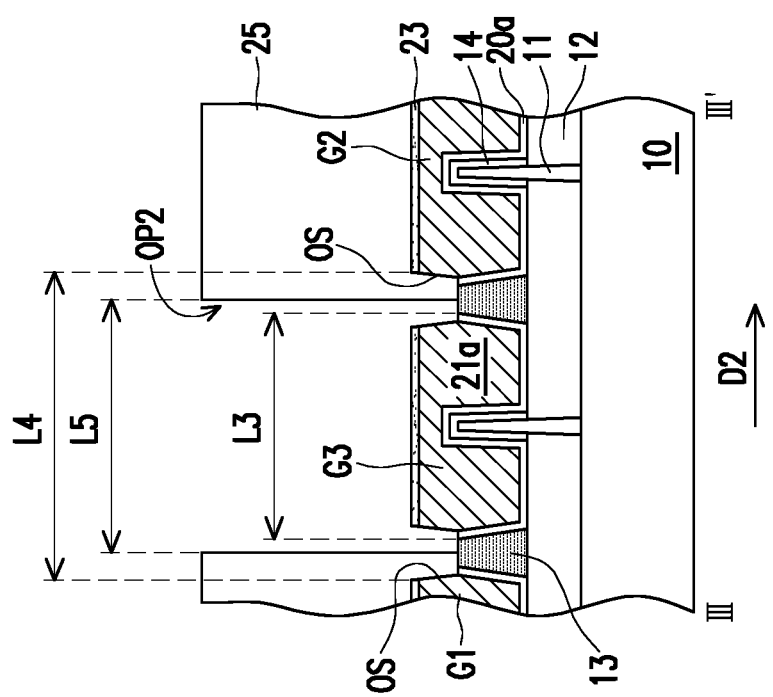

Referring to FIG. 1D, FIG. 7A and FIG. 7B, the patterned mask layer 24 is removed by an ashing process, an etching process or combinations thereof, for example. Thereafter, a patterned mask layer 25 having one or more openings OP2 is formed over the substrate 10. In some embodiments, the material, the structure and the forming method of the patterned mask layer 25 may be the same as or different from those of the patterned mask layer 24. In some embodiments, the patterned mask layer 25 is a patterned photoresist formed by photolithograph including exposure and development processes. In some embodiments, the patterned mask layer 25 is also a multi-layer structure including a bottom layer, a middle layer, and a low temperature oxide layer. The multi-layer structure of the patterned mask layer 25 and forming method thereof are similar to those of the patterned mask layer 24 with reference to FIG. 17A to FIG. 17E, which are not described here again.

In some embodiments, the openings OP2 of the patterned mask layer 25 are formed over the gate lines G, extending along the same direction D2 as the gate lines G, at least exposing portions of the gate lines G. In some embodiments, the opening OP2 exposes a portion of one gate line G (such as Gb or Gc) across one or more fins 11. In some embodiments, the opening OP2 exposes the gate line G3 between the two trenches T1 (T1*b* or T1*c*) and between two hybrid fins 13. In some embodiments, since the helmet 19 is formed on the dielectric layer 18, the width W5 of the opening OP2 may be formed larger than the width of the gate line G along the first direction D1, and may larger than the space (or referred to as distance) W4 (FIG. 7B) between the helmet 19 or the dielectric layer 18 on opposite sides of the gate line G. In some embodiments, portions of the helmet 19, dielectric layer 18, the spacer 15*a* and the CESLs 17*a* on opposite sides of the exposed gate line G3 are also exposed by the opening OP2.

Referring to FIG. 1D and FIG. 7B, in some embodiments, in the second direction D2, the length L5 of the opening OP2 may be greater than the length L3 of the gate line G3, and less than the distance L4 between the gate lines G1 and G2. In accordance with some embodiments, the length L3 of the gate line G3 may be referred to as the distance L3 between two adjacent hybrid fins 13. The length L5 of the opening OP2 may be greater than the distance L3 between two adjacent hybrid fins 13, and less than the distance L4 between the two sidewalls (or end walls) OS of the gate lines G1 and G2 (FIG. 7B). In some embodiments, the opening OP2 is partially overlapped with and in spatial communication with the trench T1 (such as T1*b* or T1*c*), and portions of the hybrid fins 13 under the trenches T1 (such as T1*b* or T1*c*) may also be exposed by the opening OP2. The sidewalls OS of the gate lines G1 and G2 are covered by the patterned mask layer 25. However, the disclosure is not limited thereto. In some other embodiments, the length L5 of the opening OP2 may be equal to the distance L4 between the gate lines G1 and G2 on outer sides of the two trenches T1 (such as T1*b* or T1*c*). The opening OP2 may be overlap with and in spatial communication with the trenches T1, and may further exposes the sidewalls OS of the gate lines G1 and G2 on outer sides of the two trenches T1 (such as T1*b* or T1*c*). In some embodiments, the sidewalls of the opening OP2 may be aligned with the sidewalls (or referred to as the end walls) OS of the gate lines G1 and G2 (not shown).

Referring to FIGS. 1D, 7A and 7B to FIGS. 1E, 8A and 8B, a cutting process (or referred to as removal process) by removing the gate lines G3 exposed by the openings OP2 is performed to form trenches T2 in gate lines G (such as Gb and Gc). That is, portions of the gate lines G between the hybrid fins 13 under the trenches T1 (such as T1*b* and T1*c*) are removed. In some embodiments, the cutting process may include one or more etching process, such as dry etching process. In some embodiments, the trenches T2 includes trench T2*b* and T2*c* formed in gate lines Gb and Gc, respectively. The trench T2*b* is located between and in spatial communication with the two trenches T1*b* on ends thereof. The trench T2*c* is located between and in spatial communication with the two trenches T1*c* on ends thereof. The trenches T2 are extending along the second direction D2. The gate line G is cut off by the trenches T1 and the hybrid fins 13 underlying the trenches T1 and/or the trenches T2. For example, the gate line Ga is cut off by the trench T1*a* and the hybrid fins 13 underlying the trench T a. The gate line Gd is cut off by the trench T1*d* and the hybrid fins 13 underlying the trench T1*d*. The gate line Gb is cut off by the trenches T1*b*, the trench T2*b* and the hybrid fins 13 underlying the trench T1*b*. The gate line Gc is cut off by the trenches T1*c*, the trench T2*c* and the hybrid fins 13 underlying the trench T1*c*. As a result, two groups of gate lines G1 and G2 are remained, and are disconnect to each other.

Figure 1E:
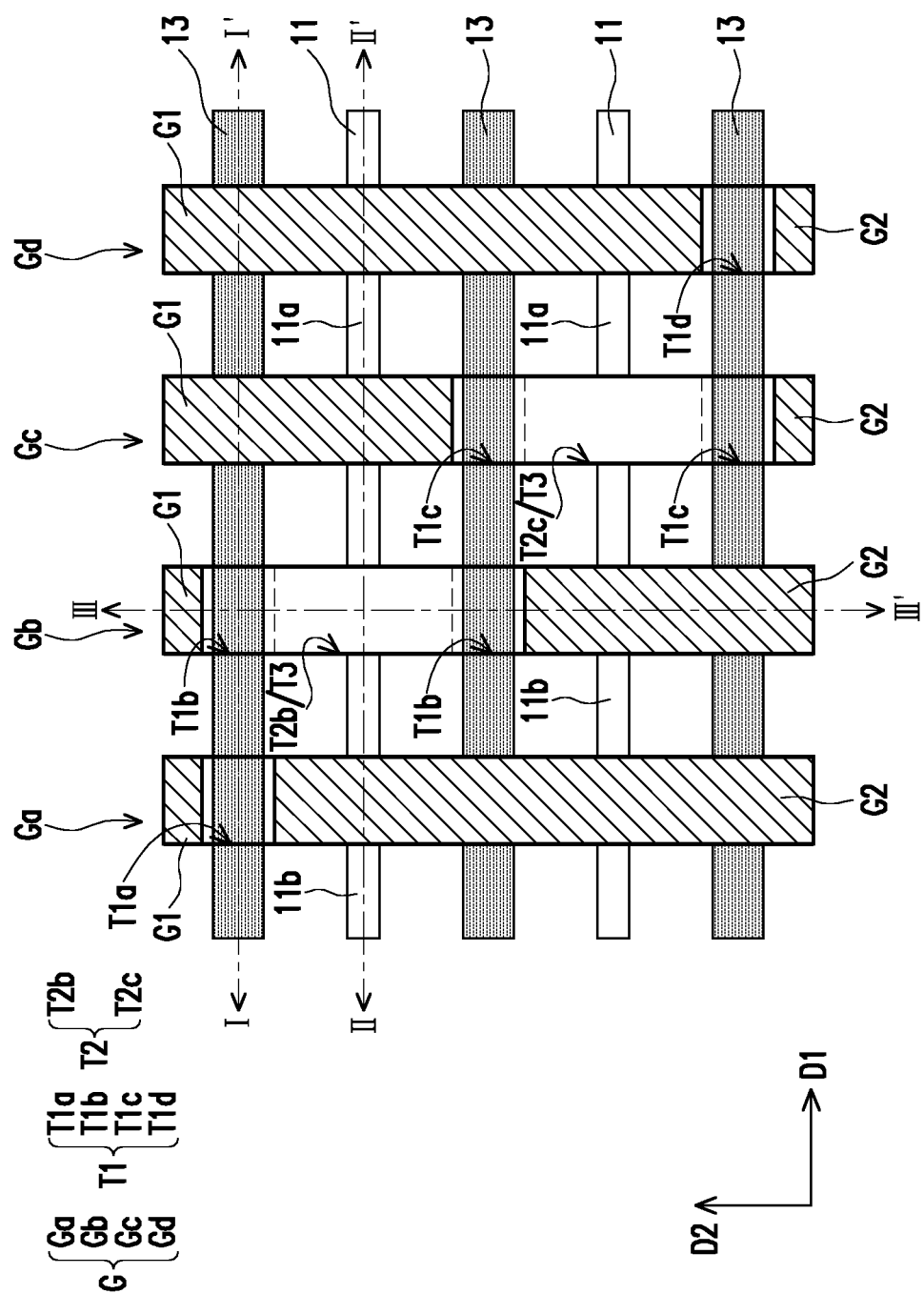
Figure 8A:
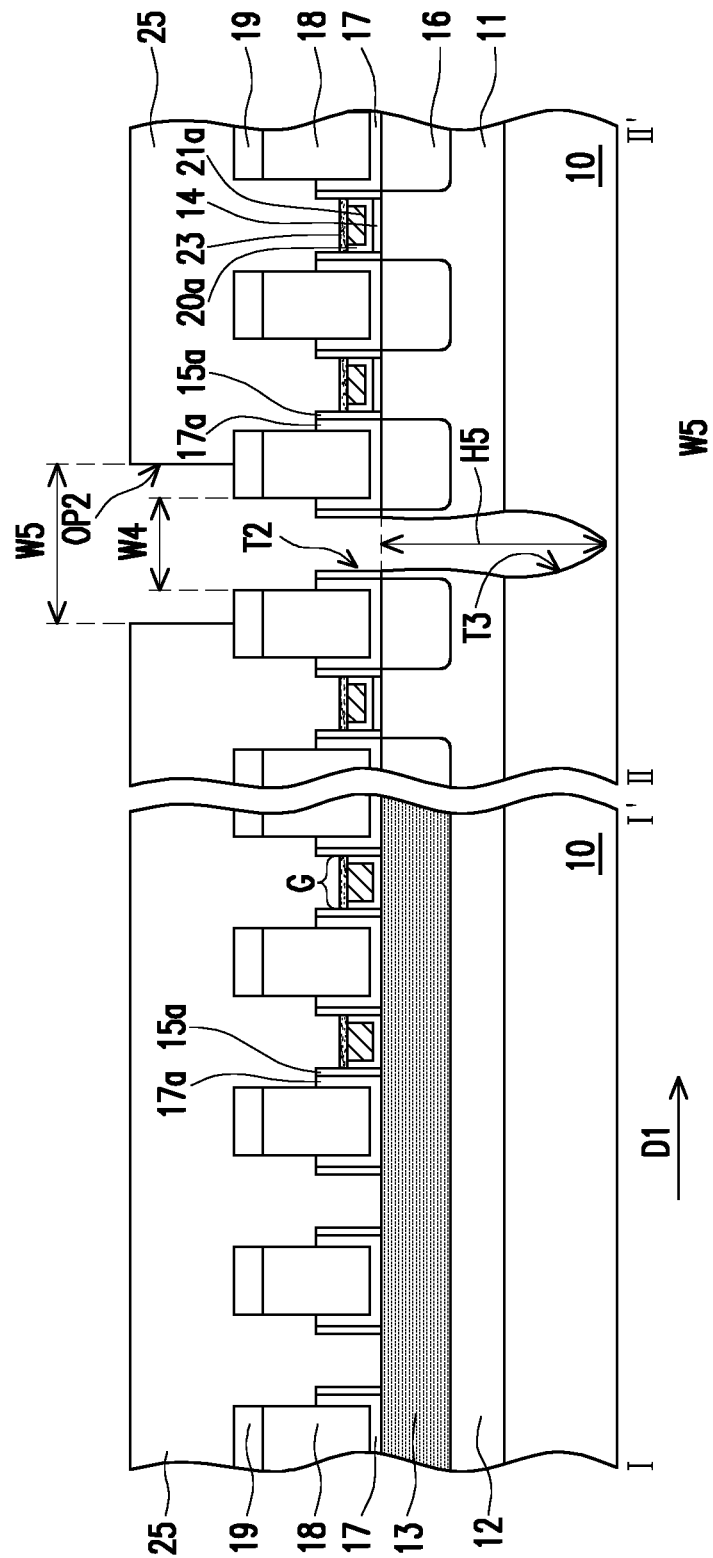
Figure 8B:
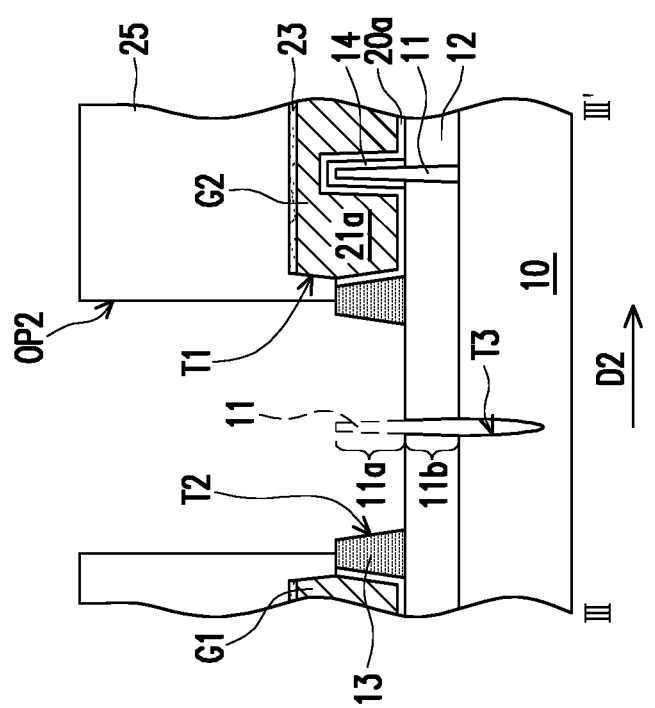

Referring to FIG. 1E, FIG. 8A and FIG. 8B, after the gate lines G are partially removed, portions of top surfaces and sidewalls of the two hybrid fins 13 underlying the two trenches T1 facing each other, a portion of the top surface of the isolation structure 12, and parts of the upper portions 11*a* of the fins 11 (shown as the dotted line in FIG. 8B) protruding on the isolation structure 12 are exposed by the trenches T2. Thereafter, the upper portions 11*a* of the fins 11 exposed by the trenches T2, and the lower portions 11*b* of the fins 11 covered by the isolation structure 12 underlying the exposed upper portions 11*a* are further removed, and a trench T3 underlying the trench T2 is formed in the fin 11 and in the isolation structure 12. In some embodiments, the trench T3 is further deepened by removing a portion of the substrate 10. That is to say, the trench T3 is formed in the fin 11, the isolation structure 12 and in the substrate 10. In some embodiments, the fin 11 and the substrate 10 are removed by one or more etching process, such as anisotropic etching process, isotropic etching process, or combinations thereof. The etching process may be, dry etching, wet etching or combinations thereof.

Referring to FIG. 8A and FIG. 8B, in some embodiments, the cross-section shape of the trench T3 may be bowling shaped, vase shaped, or the like. In some embodiments, the depth H5 (from the top surface of the fin 11 to the bottom of the trench T3) of the trench T3 is larger than the height H1 (FIG. 2B) of the fin 11. In some embodiments, the depth H5 of the trench T3 is larger than 150 nm, for example. In some embodiments, the depth H5 of the trench T3 ranges from 90 nm to 250 nm, for example. Referring to FIG. 8A, in some embodiments, along the first direction D1, the trench T3 has a non-uniform width from top to bottom. For example, the width of the trench T3 may be decreased then increased and then decreased gradually from top to bottom. In some embodiments, the width of the trench T3 may be decreased gradually from the top surface of the fin 11 to the level of the depth of the strained layer 16, such that strained layers 16 on sides of the trench T3 would not be damaged upon the formation of the trench T3. The largest width of the trench T3 may be under the bottom of the strained layer 16, and may be in the fin 11, at the interface between the fin 11 and the substrate 10, or in the substrate 10. The structure feature (such as shape, height, width) of the trench T3 described above is merely for illustration, and the disclosure is not limited thereto.

Referring to FIG. 1E, in some embodiments, the trench T3 is configured to cut or disconnect the fins 11 and therefore to fully isolate the devices at opposite sides of the trench T3 in the first direction D1. In some embodiments, the fin 11 is cut into two groups of fins 11a and 11b.

Figure 1F:
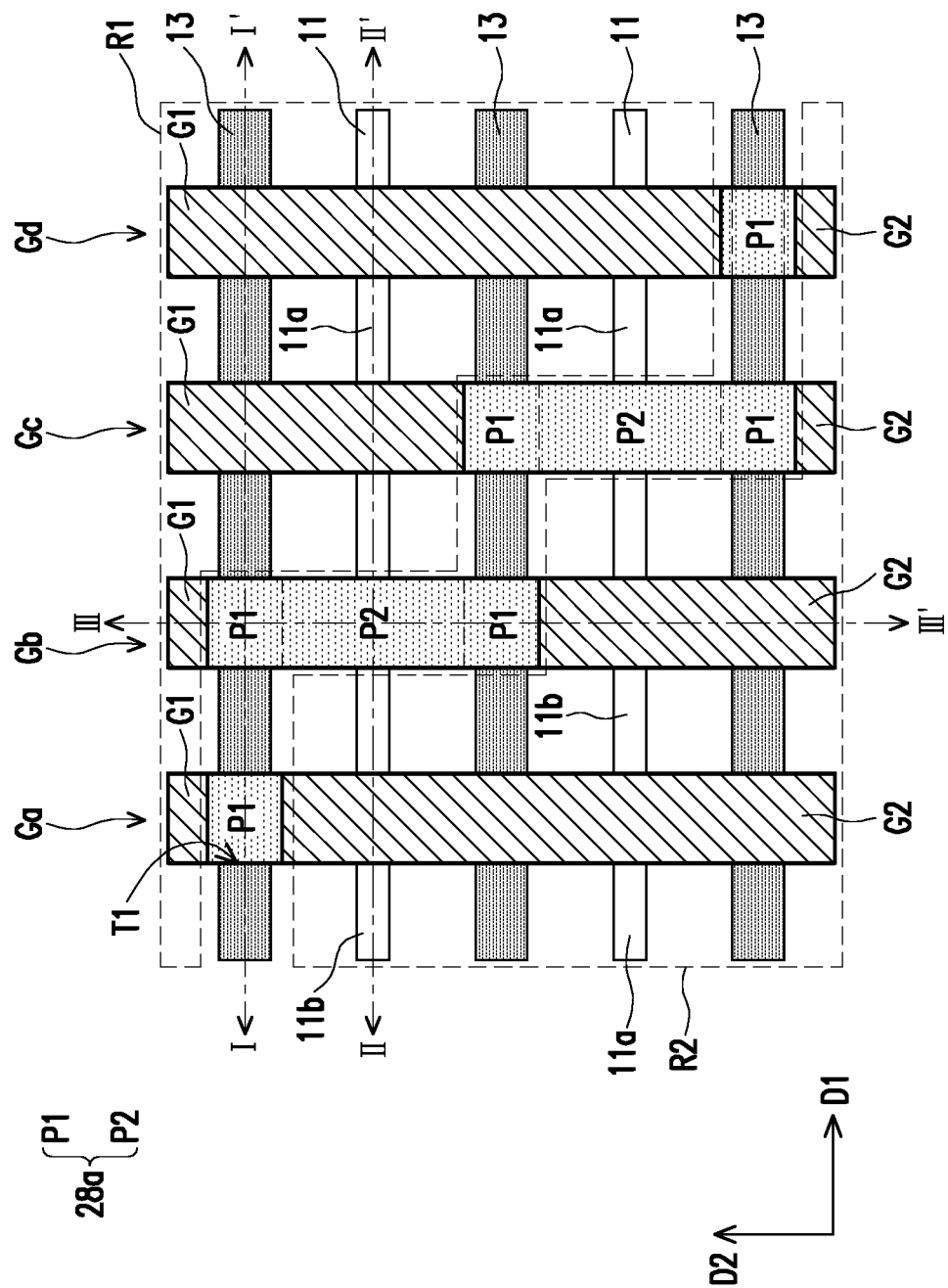
Figure 9A:
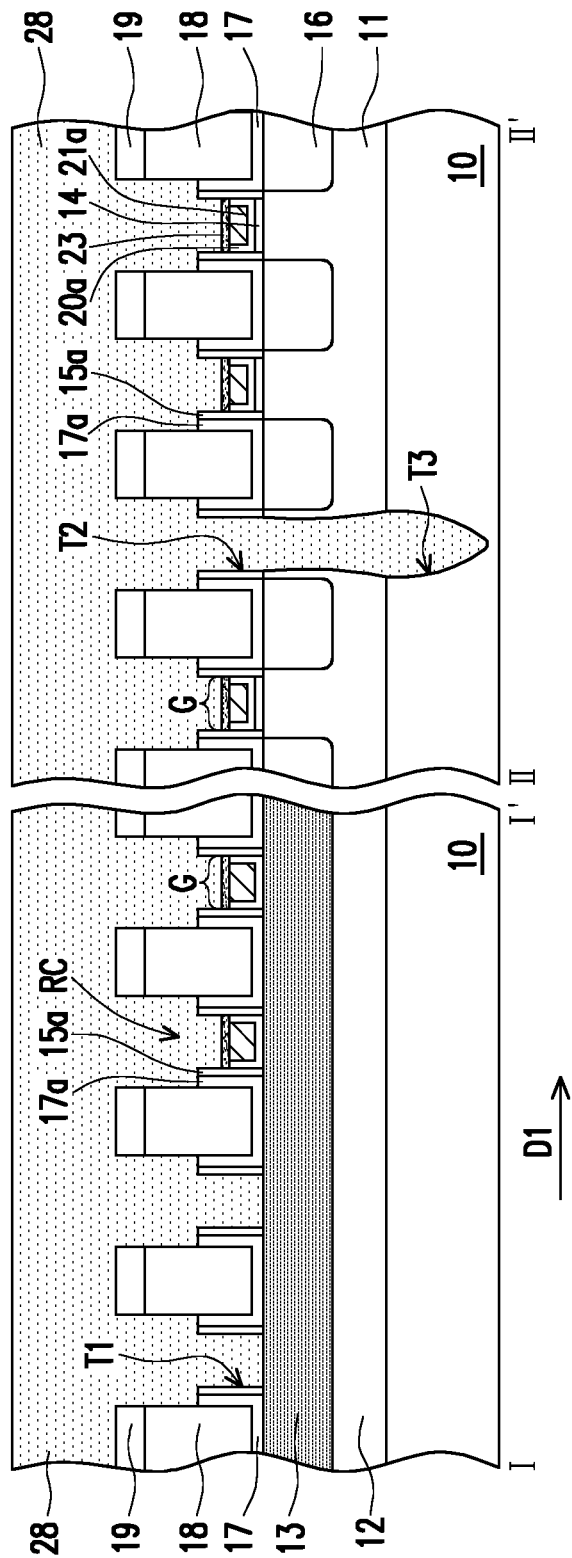
Figure 9B:
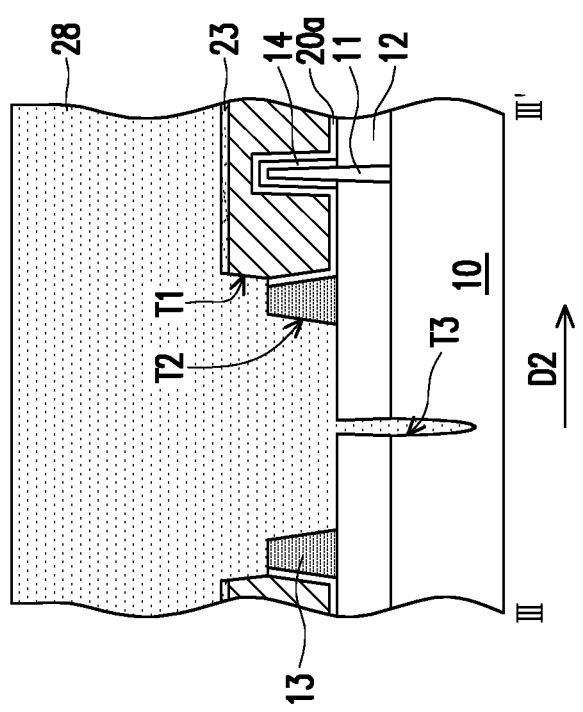
Figure 10A:
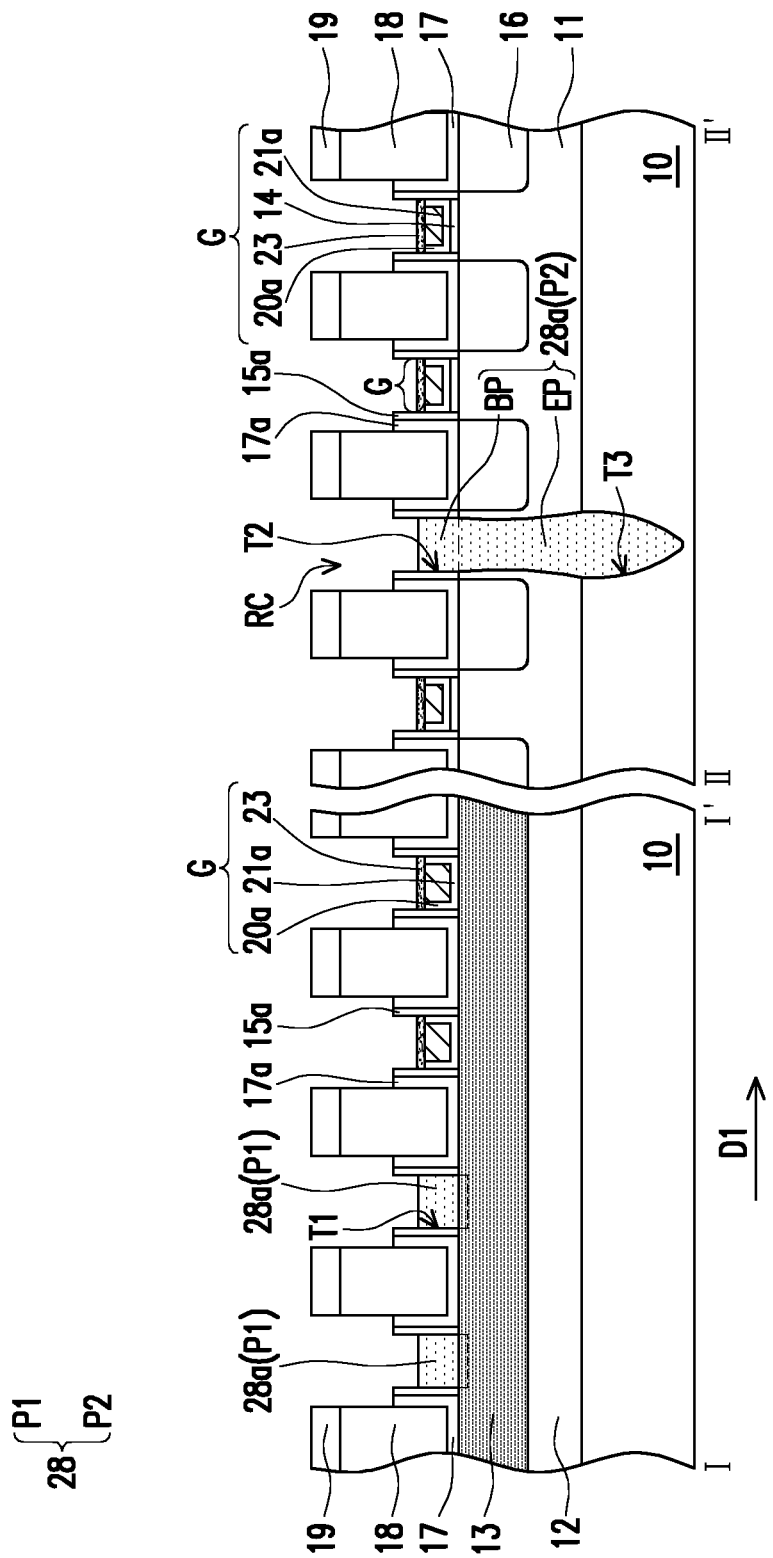
Figure 10B:
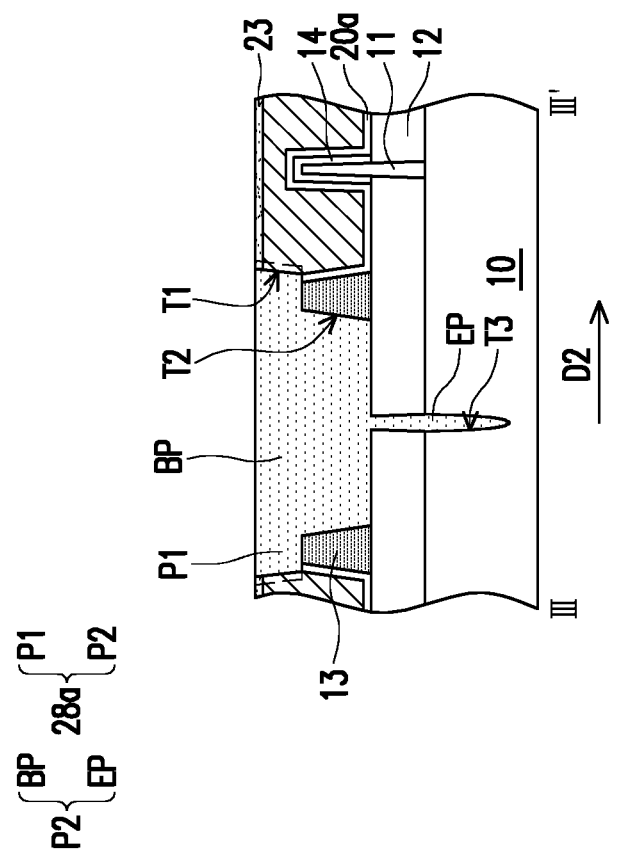

Referring to FIG. 1F, FIG. 10A and FIG. 10B, an insulating structure 28a is then formed in the trenches T1, T2 and T3. The insulating structure 28a may be formed by the following processes. Referring to FIG. 9A and FIG. 9B, in some embodiments, an insulating layer 28 is formed over the gate lines G and the helmet 19, and filled in the trenches T1, T2 and T3, and the recesses RC. The insulating layer 28 may be a single-layer structure or a multi-layer structure. In some embodiments, the material of the insulating layer 28, the material of the hybrid fin 13 and the material of the isolation structure 12 may be the same as or different from each other. In some embodiments, the insulating layer 28 includes silicon nitride, silicon oxide, silicon oxynitride or a suitable insulating material, and the forming method thereof includes performing a suitable deposition process such as CVD, HDP-CVD, FCVD, or the like.

Referring to FIGS. 9A and 9B to FIGS. 10A and 10B, a removal process is performed to remove the insulating layer 28 out of the trenches T1, T2, T3, such that the insulating structure 28a is formed. Specifically, the insulating layer 28 located over the gate lines G, that is, located over the helmet 19 and in the recess RC is removed. In some embodiments, the removal process includes an etching process, such as an etching back process. In some embodiments, the helmet 19, the spacers 15a, the CESLs 17a and the protection layer 23 of the gate line G serve as etching stop layer during the removal process. In some embodiments, after the removal process is performed, the top surface of the insulating structure 28 is substantially coplanar with the top surface of the protection layer 23 of the gate line G.

Referring to FIG. 1F, FIGS. 10A and 10B, the insulating structure 28a and the hybrid fin 13 underlying thereof are configured to electrically separate gate line G into two groups of gate lines G1 and G2, and electrically separate fins 11 into two groups of fins 11a and 11b. In some embodiments, the insulating structure 28a includes a plurality of first portions P1 and a plurality of second portions P2. In some embodiments, the first portion P1 may also be referred to as a cutting metal gate (CMG) layer, and the second portion P2 may also be referred to as a "cut poly on OD edge" (CPODE) layer. The first portions P1 is the portion of the insulating structure 28a in the trenches T1. The first portion P1 is located on the hybrid fins 13, and surrounded by the spacer 15a and the gate lines G or/and the second portion P2. Some of the first portions P1 are in contact with the second portion P2, and some of the first portions P1 are not in contact with the second portion P2. For example, in the gate line Ga or Gd, the first portion P1 of the insulating structure 28a is located on the hybrid fin 13, between and in contact with the spacers 15a along the first direction D1, between and in contact with the gate lines G1 and G2 along the second direction D2. In the gate line Gb or Gc, the first portion P1 is located on the hybrid fin 13, between and in contact with the spacers 15a along the first direction D1, between and in contact with the gate line G1 or G2 and the second portion P2 along the second direction D2.

As shown in FIG. 1F, FIG. 10A and FIG. 10B, in some embodiments, the bottom surface of the first portion P1 may be in contact with the hybrid fin 13, and may further be in contact with the gate dielectric layer 20a and metal gate electrode 21a (shown as the dotted line in FIG. 10B) of the gate line G. In some embodiments, the bottom surface of the first portion P1 is in contact with the hybrid fin 13, and is substantially coplanar with or lower than (see the dotted line in FIG. 10A) the bottom surface of the gate line G on the hybrid fin 13 (or the topmost surface of the hybrid fin 13), but the disclosure is not limited thereto. In some embodiments, a portion of the sidewall of the first portion may be in contact with the hybrid fin 13 (shown as the dotted line in FIG. 10A). The top surface of the first portion P1 is substantially coplanar with the top surface of the protection layer 23 of the gate line G. In some embodiments, the first portion P1 and the hybrid fin 13 underlying thereof are configured to electrically separate gate line G into two groups of gate lines G1 and G2 along the second direction D2. Take the gate line Ga or Gd for example, the first portion P1 cut and electrically separate the gate line Ga (or Gd) into two groups of gate lines G1 and G2. The two groups of gate lines G1 and G2 of the gate line G are located at opposite sides of the first portion P1 along the second direction D2, and are electrically and physically isolated from each other by the first portion P1 of the isolation structure 28a therebetween. In some embodiments, one gate line G (such as gate lines Ga and Gd) is corresponding to one first portion P1, but the disclosure is not limited thereto. One gate line G (such as gate lines Gb and Gc) may be correspond to two or more first portions P1 according to the product design.

In some embodiments, the second portion P2 is extending along the second direction D2, and located between two first portions P1 and between two hybrid fins 13 underlying the two first portions P1. The second portion P2 is in contact with the first portions P1. Further, in the second direction D2, the sidewalls (or referred to as end walls) of the second portion P2 are in contact with the sidewalls (or referred to as end walls) of the hybrid fins 13. In some embodiments, the top surface of the second portion P2 is substantially coplanar with the top surface of the first portion P1 and the top surface of the protection layer 23 of the gate line G (such as the gate line Gb and Gc). In the embodiments of the disclosure, the second portion P2 and the first portion P1 are formed simultaneously. As such, no interface is formed between the second portion P2 and the first portion P1.

The second portion P2 is across the fin 11, cutting the fin 11 into two groups of fins 11a and 11b at two opposite sides of the second portion P2 along the first direction D1, and therefore to fully isolate the gate lines G and devices at opposite sides of the second portions P2 on the fins 11a and 11b. That is, the two groups of the fins 11a and 11b are physically and electrically separated from each other by the second portion P2 of the insulating structure 28a therebetween. As a result, the gate lines G (such as the gate line sections G1 of the gate lines Gc and Gd) on the fins 11a and the gate lines G (such as the gate line sections G2 of the gate lines Ga and Gb) on the fins 11b are electrically isolated from each other by the second portions P2 of the insulating structure 28a.

In some embodiments, the second portion P2 includes a body portion BP in the trench T2 and an extending portion EP in the trench T3. The body portion BP is located on and in contact with the isolation structure 12 and the extending portion EP, as shown in FIGS. 10A and 10B. In the first direction D1, the body portion BP is located between and in contact with the spacers 15a (FIG. 10A). In the second direction D2, the body portion BP is located between the first portions P1 and the hybrid fins 13 underlying the first portions P1 (FIG. 10B).

The extending portion EP extends into the fins 11a and 11b, the isolation structure 12 and the substrate 11. The extending portion EP is located between the fins 11a and 11b, and surrounded by the fins 11a and 11b, the isolation structure 12, and the substrate 11.

As shown in FIGS. 1F and 10B, in some embodiments, the first portions P1 of the insulating structure 28 and the hybrid fins 13 underlying thereof cut and (electrically and physically) separate the gate lines G into two groups of gate lines G1 and G2 along the second direction D2. The second portions P2 of the insulating structure 28 cut and (electrically and physically) separate the fin 11 into two groups of fins 11a and 11b along the first direction D1. As a result, two regions R1 and R2 isolated from each other are defined upon the formation of the insulating structure 28a. Gate lines G1 across fins 11a are provided in the region R1. Gate lines G2 across fins 11b are provided in the second region R2. The gate lines G1 and other devices in the region R1 and the gate lines G2 and other devices in the region R2 are isolated and electrically separated from each other by the insulating structure 28a. It is noted that, the configuration of the insulating structure 28a shown in FIG. 1F is merely for illustration, and the disclosure is not limited thereto.

Figure 11A:
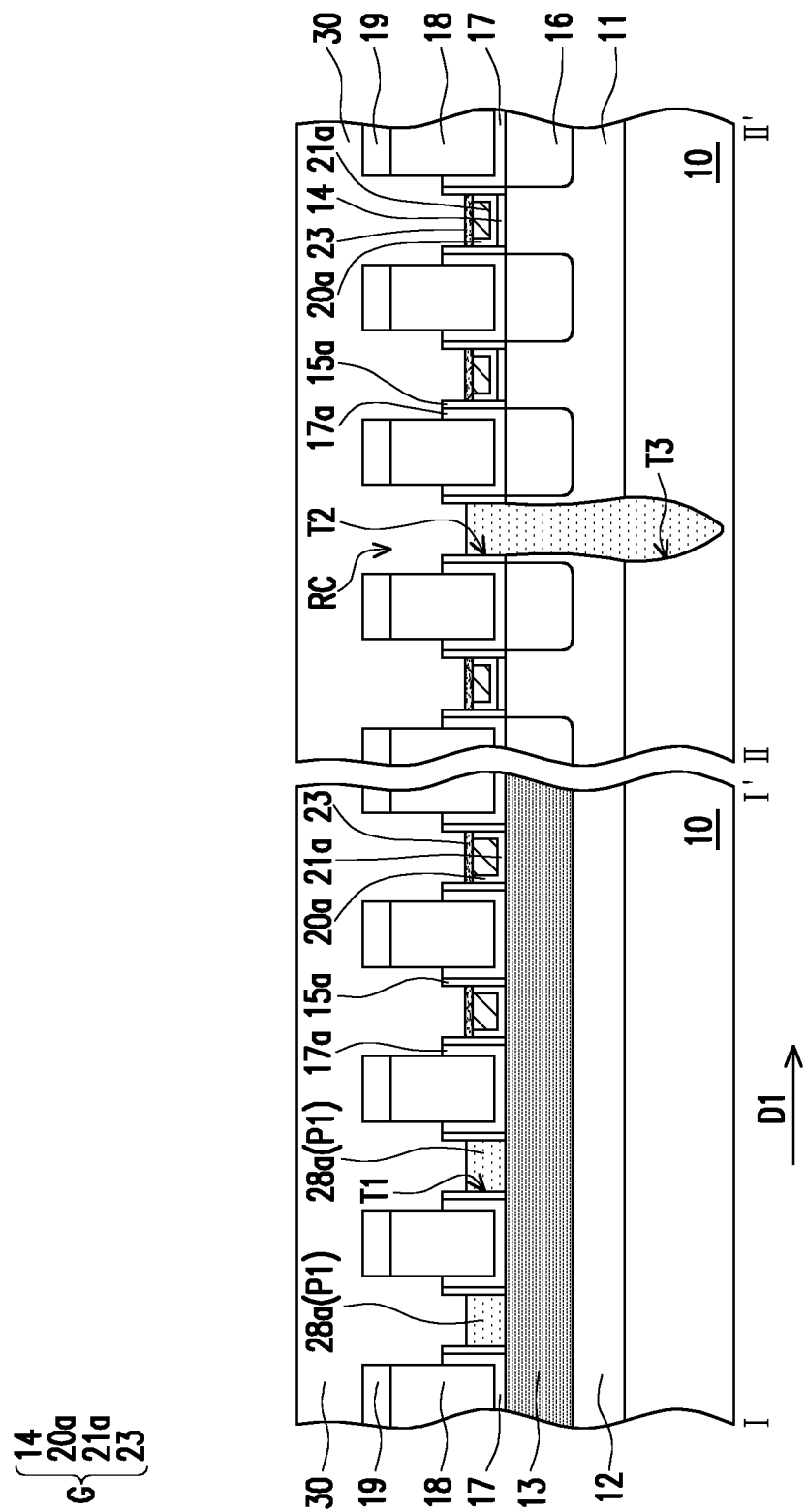
Figure 11B:
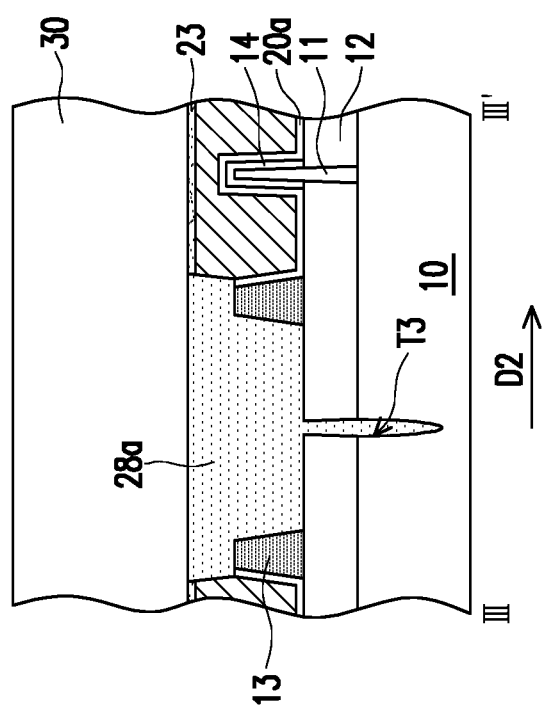

Referring to FIG. 11A and FIG. 11B, a helmet material layer 30 is formed over the helmet 19, the gate lines G and the insulating structure 28a. The helmet material layer 30 may include a material the same as or different from that of the helmet 19, and different from the material of the insulating structure 28a. The helmet material layer 30 includes dielectric material, such as nitride (e.g. silicon nitride), oxide (e.g. silicon oxide), silicon oxycarbide, or combinations thereof. In some embodiments, the helmet dielectric material layer may include high-K dielectric material or low-K dielectric material. The high-K material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, combinations thereof, or a suitable material. The forming method of the helmet material layer 30 may include a suitable deposition process such as CVD HDP-CVD, FCVD, or the like, or combinations thereof.

Referring to FIGS. 11A and 11B to FIGS. 12A and 12B, a planarization process such as CMP, is performed to remove the helmet material layer 30 and the helmet 19 over the dielectric layer 18, so as to form a helmet 30a. In some embodiments, the top surface of the helmet 30a is substantially coplanar with the top surface of the dielectric layer 18.

Figure 12A:
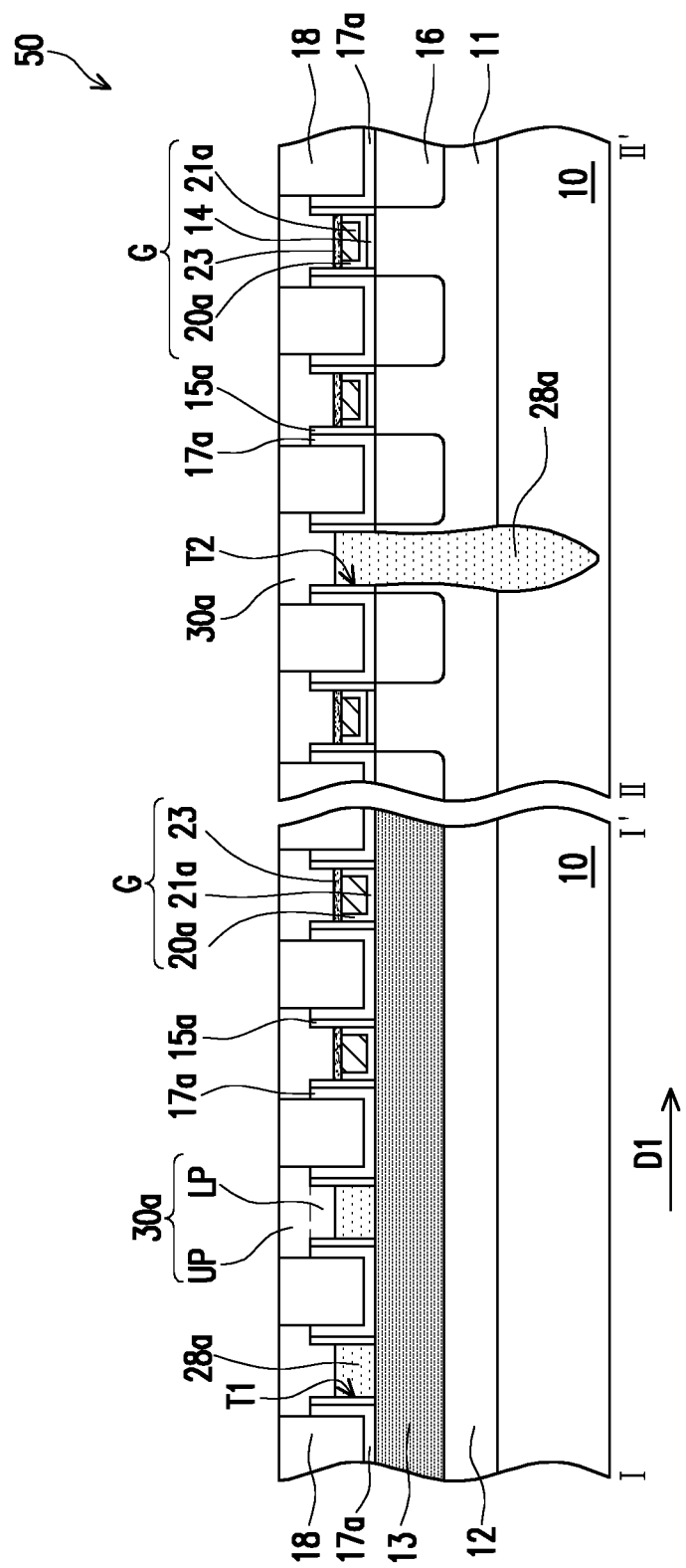
Figure 12B:
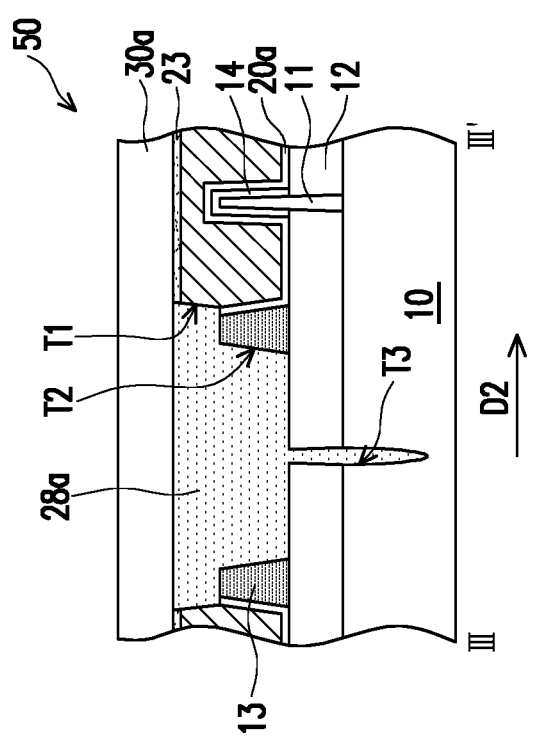

The helmet 30a is disposed on and in physical contact with top surfaces of the gate lines G and insulating structure 28a, and between the dielectric layer 18, extending along the second direction D2. In other words, the gate lines G and the insulating structure 28 are protected by the helmet 30a. In some embodiments, the cross-section shape of the helmet 30a is T-shaped, but the disclosure is not limited thereto. In some embodiments, the helmet 30a includes a lower portion LP and an upper portion UP on the lower portion LP. As shown in FIG. 12A and FIG. 12B, the lower portion LP is located on the insulating structure 28a and the gate line G, and between the spacers 15a. The sidewalls of the lower portion LP are in contact with the spacers 15a. The upper portion UP is located on the lower portion LP, the spacers 15a and the CESLs 17a. The bottom surface of the upper portion UP is in physical contact with the top surfaces of the spacers 15a and the CESLs 17a. The sidewalls of the upper portion UP are in contact with the dielectric layer 18.

Still referring to FIG. 1F and FIGS. 12A and 12B, a FinFET device 50 is thus completed. In some embodiments, the FinFET device 50 includes a plurality of fins 11a and 11b, hybrid fins 13, a plurality of gate lines G1 and G2, and the insulating structure 28a. The fins 11a and 11b are disposed on the substrate 10. The isolation structure 12 is disposed on the substrate 10 and covers or surrounds lower portions of the fins 11a and 11b. The insulating structure 28a and the hybrid fin 13 underlying thereof define two regions R1 and R2 of the FinFET device 50. In other words, devices in the region R1 and devices in the region R2 are isolated from each other by the insulating structure 28a therebetween. The insulating structure 28a is located between and in physical contact with the gate lines G1 and G2, and the fins 11a and 11b. The gate lines G1 and the fins 11a are located in the region R1, the gate line G2 and the fins 11b are located in the region R2. The gate lines G1 are across the fins 11a in the region R1. The gate lines G2 are across the fins 111b in the region R2.

In some embodiments, the FinFET device 50 further includes strained layers 16 in the fins 11a and 11b and aside the gate lines G1 and G2, the gate lines G1 and G2 includes the interfacial layer 14, the gate dielectric layer 20a, the metal gate electrode 21a, and the protection layer 23. Spacers 15a are disposed on sidewalls of the gate lines G1 and G2. Dielectric layer 18 is disposed over the substrate 10 and aside the gate lines G1 and G2. CESLs 17a are disposed between the dielectric layer 18 and the spacers 15a and between the dielectric layer 18 and the substrate 10. Helmets 30a are disposed on the gate lines G1 and G2 and the insulating structure 28a and on the spacers 15a and the CESLs 17a.

In some embodiments, subsequent processes may be performed on the FinFET device 50. For example, a first contact hole (or referred to as a first contact trench) may be formed through the dielectric layer 18 and the CESL 17 to expose the strained layer 16, and a first connector may be formed in the first contact hole to electrically connect to the strained layer 16. A second contact hole (or referred to as a second contact trench) may be formed through the helmet 30a on the gate line G1 or G2. The second contact hole may further penetrate through the protection layer 23 on the metal gate electrode 21a. Thereafter, a second connector is formed in the second contact hole to electrically connect to the metal gate electrode 21a of the gate line G1 or G2. In some embodiments, the protection layer 23 serves as an etching stop layer during forming the second contact hole, and may provide the function of reducing resistance of the metal gate electrode 21a.

Figure 16:
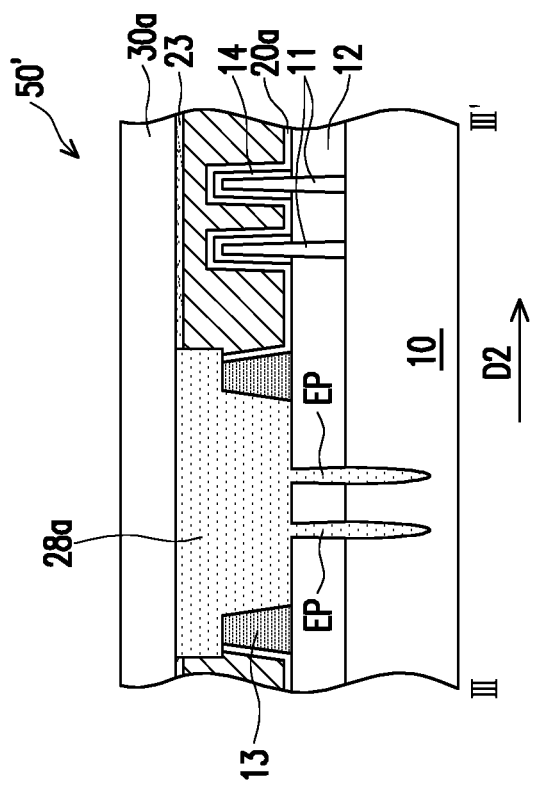
FIG. 16 is a schematic cross-sectional view of a FinFET device according to some embodiments of the disclosure.

In the foregoing embodiments, one fin 11 is disposed between two adjacent hybrid fins 13, and the resulting insulating structure 28 has one extension part EP (FIG. 10B), but the disclosure is not limited thereto. Referring to FIG. 16, In some other embodiments in which two fins 11 are disposed between two adjacent hybrid fins 13, a FinFET device 50' may be formed with the insulating structure 28 has two extending part EP.

In the first embodiment of the disclosure, the trenches T1 for forming the CMG and the trenches T2 and T3 for forming the CPODE are formed sequentially. Two patterning processes using two patterned mask layer are performed sequentially to form the trench T1 and the trenches T2 and T3, so as to cut the gate lines and fins, but the disclosure is not limited thereto. In some other embodiments, the trenches T1, T2 and T3 may be formed simultaneously in one patterning process using one patterned mask layer.

Figure 13A:
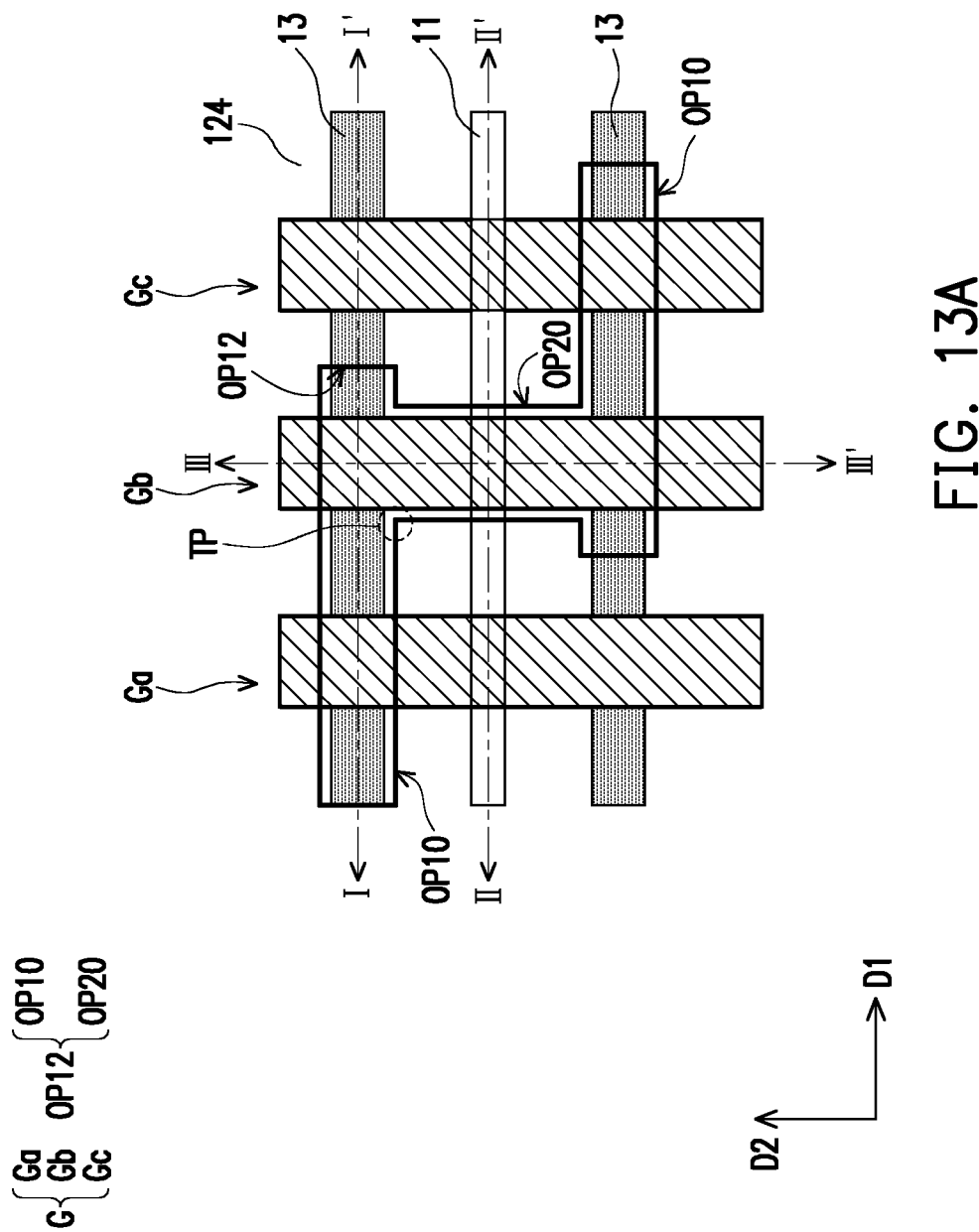
FIG. 13A and FIG. 13B are simplified top views of a middle step of a method of forming a FinFET device in accordance with a second embodiment of the disclosure.
Figure 13B:
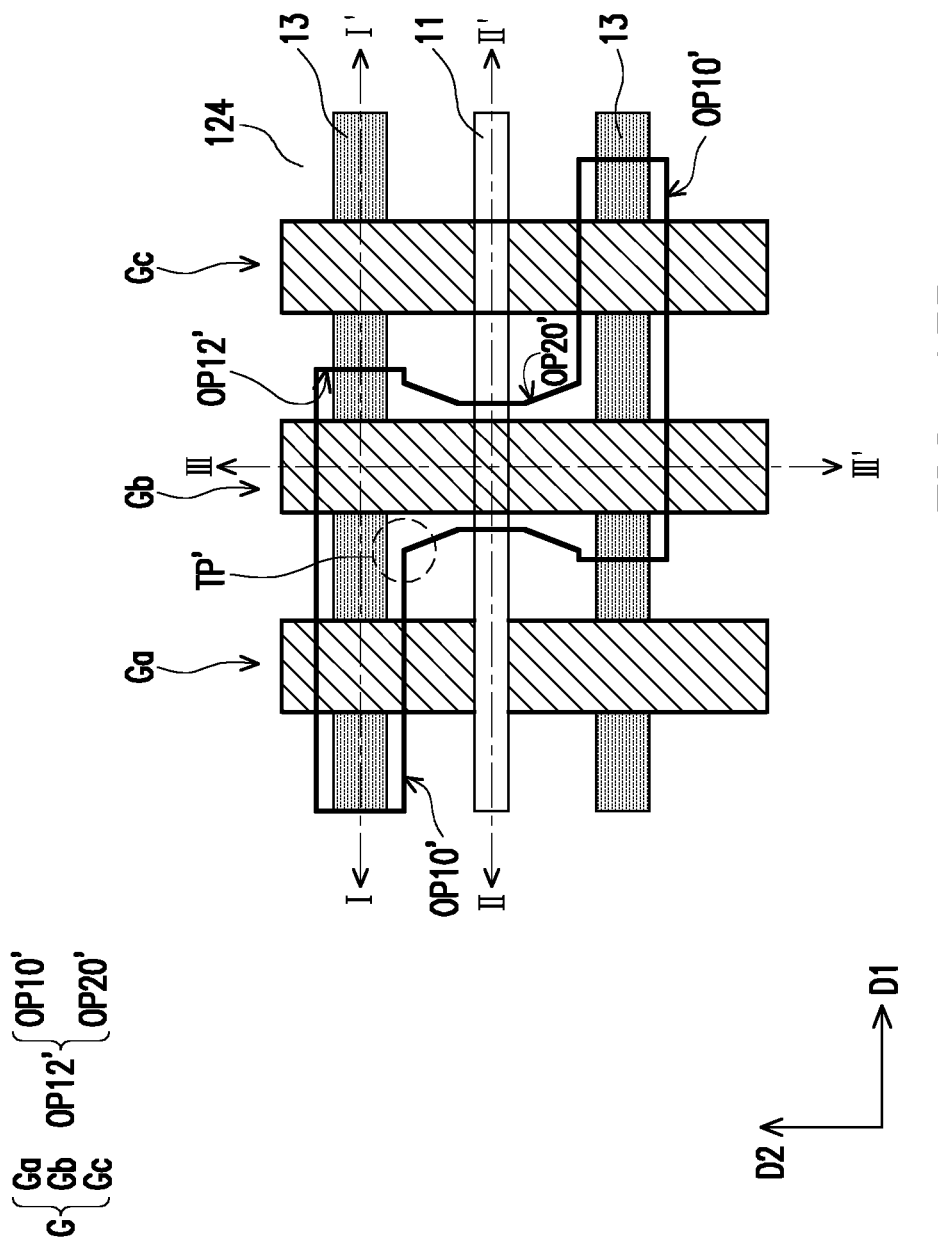

FIG. 13A and FIG. 13B illustrate top views of the configuration of a patterned mask layer for forming the trenches T1, T2, T3 according to a second embodiments of the disclosure. It is noted that, for the sake of brevity, two hybrid fins and one fin are shown in FIGS. 13A and 13B. FIGS. 14A and 14B to FIGS. 15A and 15B illustrate the cutting process of gate lines and fins according to the second embodiments of the disclosure. The processes of the second embodiment are similar to those of the first embodiment, except that the trenches T1, T2, T3 are together formed in one patterning process using one patterned mask layer. The difference of the second embodiment from the first embodiment is described in detail as below, and the similar processes of the second embodiment as the first embodiment are not repeated again here.

Referring to FIGS. 4A and 4B and FIGS. 14A and 14B, after the gate lines G are formed, a patterned mask layer 124 is formed on the gate lines G and the helmet 19. The materials and forming method of the patterned mask layer 124 may be the same as or different from those of the patterned mask layer 24 or 25 in the first embodiment, and are not descried again. The patterned mask layer 124 has an opening OP12, exposing portions of the gate lines G and portions of the helmets 19, spacers 15a and CESLs 17a on sides of the portions of the gate lines G.

Referring to FIG. 13A, in some embodiments, the top view of the opening OP12 is "工" shaped, I-shaped, inverted H-shaped, horizontal H-shaped, horizontal h-shaped, Z-shaped or the like. The opening OP12 includes first portions OP10 and a second portion OP20 in spatial communication with each other. In some embodiments, the positions of the first portion OP10 and the second portion OP20 are substantially the same as the openings OP1 and the opening OP2 described in FIGS. 5 and 6 of the first embodiment. The profile of the opening OP12 is substantially the same as the combination of the opening OP1 (FIG. 1B) and the opening OP2 (FIG. 1D) in the first embodiment.

In some embodiments, the first portion OP10 is extending along the first direction D1, across two gate lines G, exposing portions of the two gate lines G on the hybrid fins 13, and portions of the helmet 19. The second portion OP20 is extending along the second direction D2, across one or more fins 11, exposing a portion of the gate line G. In some embodiments, the second portion OP20 is between the two first portions OP10 on ends thereof. In some embodiments, the two first portions OP10 are staggered, and partially overlapped with each other in the second direction. For example, one of the first portions OP10 is across the gate lines Ga and Gb, and another one of the first portions OP10 is across the gate lines Gb and Gc, while the second portion OP20 is over the gate line Gb, and between the two first portions OP10.

Figure 14A:
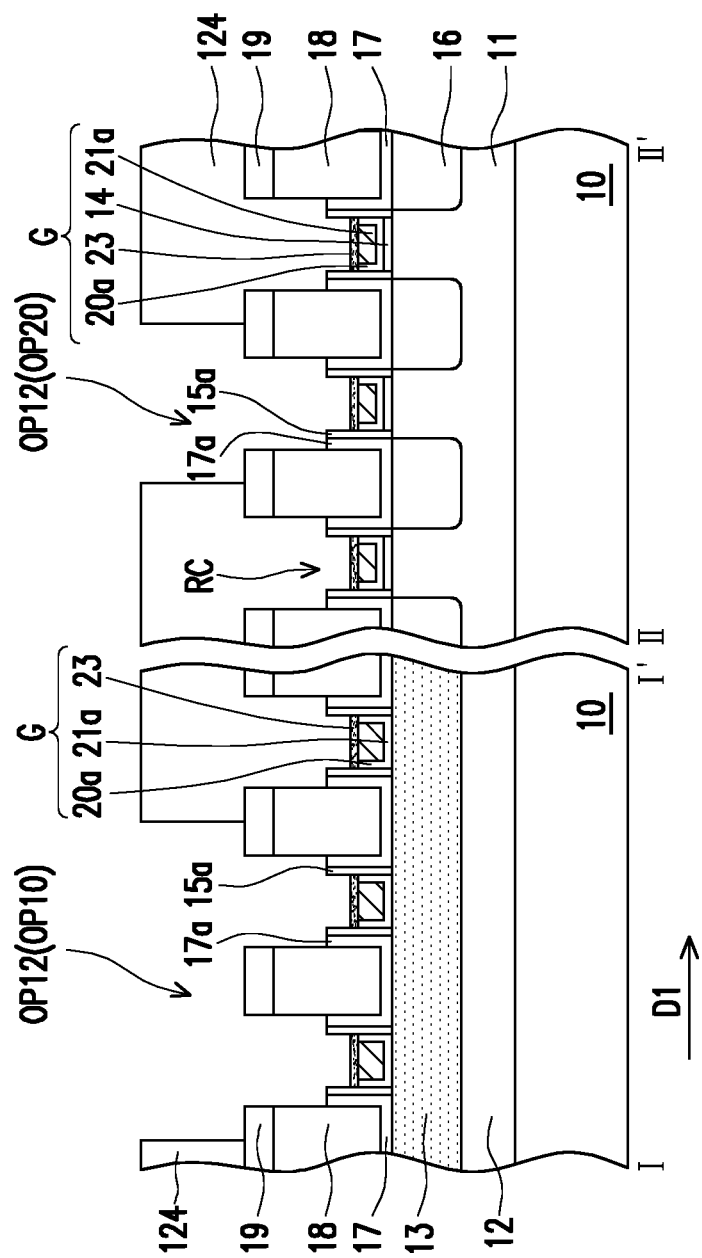
Figure 14B:
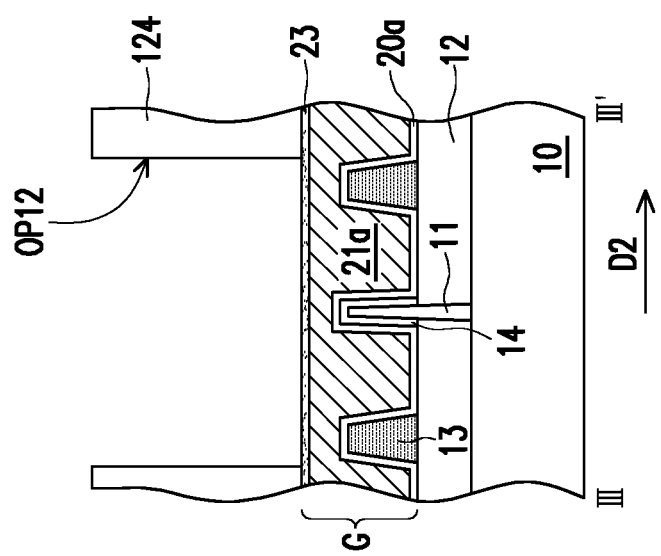

Referring to FIG. 14A, in some embodiments, the first portions OP10 exposes portions of two gate lines G, portions of top surfaces of the helmets 19 on outer sides of the exposed two gate lines Ga and Gb, the top surface of the helmet 19 between (that is, on inner sides of) the exposed two gate lines Ga and Gb, the CESLs 17a and the spacers 15a aside the exposed two gate lines G. The second portion OP20 exposes a portion of the gate line G between two hybrid fins 13 and portions of the top surfaces of the helmets 19, the spacers 15a and the CESLs 17a on sides of the exposed gate lines Gb.

As shown in FIG. 13A, in some embodiments, the shapes of the first portions OP10 and second portions OP20 of the opening OP12 may be regular strip shaped, the turning point TP between the first portion OP10 and the second portion OP20 may be about a right angle. However, the disclosure is not limited thereto. As shown in FIG. 13B, in the embodiments of the disclosure, since helmets 19 are formed on the dielectric layer 18 and may also serve as the etching mask in the subsequent process, the opening OP12' of the patterned mask layer 124 may have an irregular "工" shaped or irregular I-shaped top view. Specifically, compared to the opening OP12 shown in FIG. 13A, the opening OP12' may be expanded to have a larger size than the opening OP12. The shape of the second portion OP20' of the opening OP12' may be butterfly-like shaped or bow-knot shaped. The turning point TP' between the first portion OP10' and the second portion OP20' may include an obtuse angle.

Figure 15A:
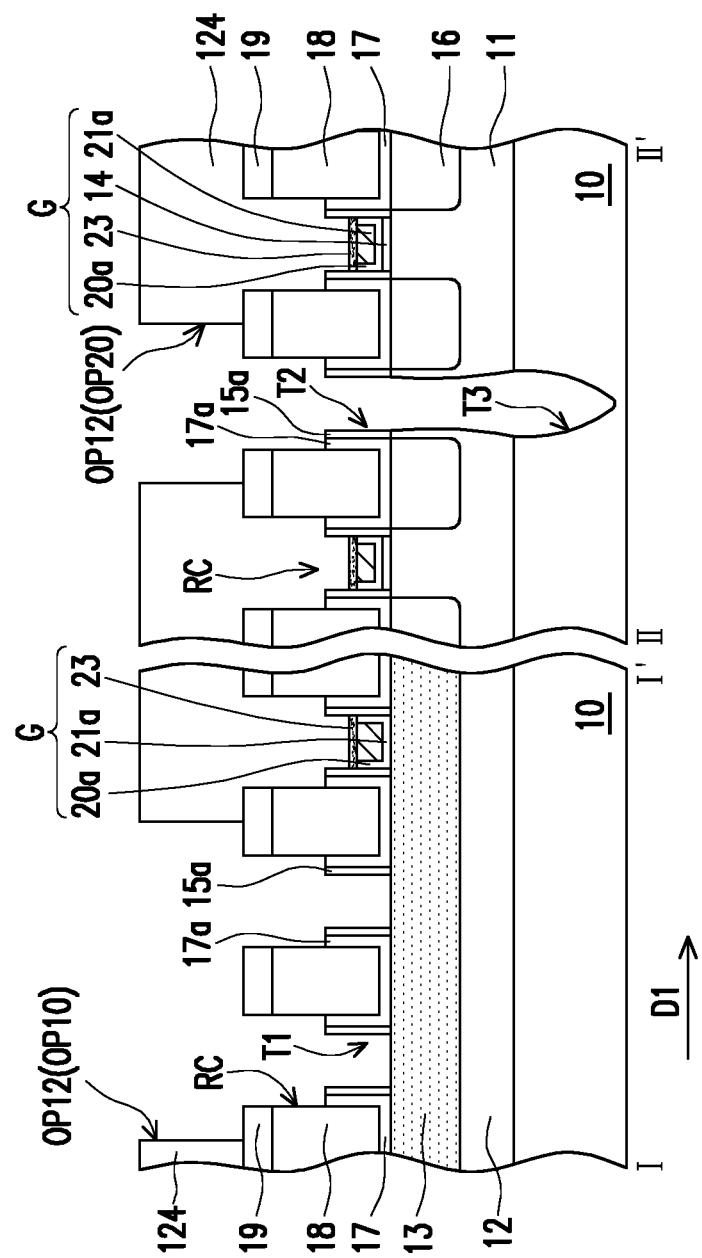
Figure 15B:
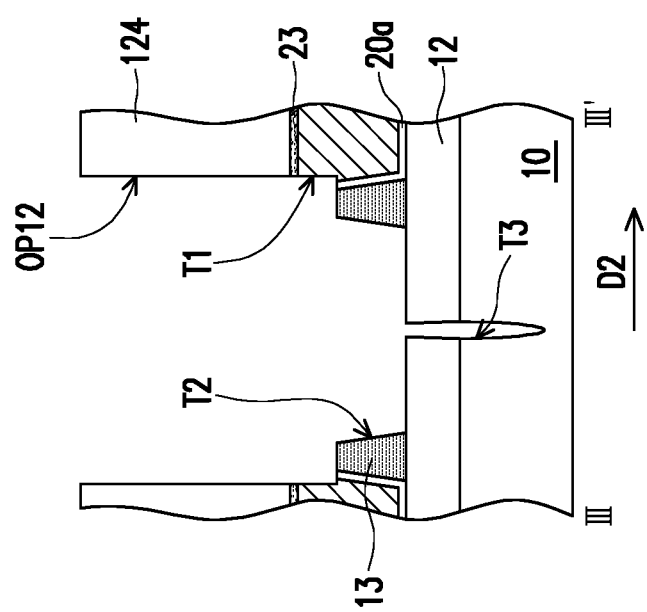

Referring to FIG. 15A and FIG. 15B, a removal process is performed to remove the gate lines G and the underlying fin 11 and a portion of the substrate 10 underlying the fin 11 exposed by the opening OP12, so as to form the trenches T1, T2 and T3. The resulting structure is substantially the same as the structure shown in FIG. 8A and FIG. 8B. The removal process includes one or more etching processes with the patterned mask layer 124 and the helmet 19 as an etching mask. In some embodiments, the removal process is similar to the removal processes described in FIG. 6A/6B and FIG. 8A/8B, the difference lies in that the removal processes illustrated in FIG. 6A/6B and FIG. 8A/8B of the first embodiment are performed simultaneously in the second embodiment. Thereafter, the patterned mask layer 124 is stripped, and processes from FIGS. 9A and 9B to FIGS. 12A and 12B are performed. The insulating structure is formed in the trenches, and a protection layer is formed on the insulating structure. Other processes and resulting FinFET device of the second embodiment are substantially the same as or different from those of the first embodiment, and are not described again.

In the embodiments of the disclosure, cutting processes of the gate lines and fins, that is, the forming of the trenches for CMG and CPODE are performed just (immediately) after the metal gate etching back process, and the insulating structure is filled in the trenches simultaneously after the trenches are formed. As such, the process is simplified and cost is reduced. On the other hand, with the forming of the hybrid fins, gate high loss for cutting metal gate electrode is reduced, and high etching bombardment during the formation of the trenches for CMG is reduced. On the other embodiments of the disclosure, the trenches for CMG and CPODE are formed by one patterning/cutting process using one patterned mask layer, the process is further simplified and the cost is further reduced.

In accordance with some embodiments of the disclosure, a method of forming a FinFET device includes the following steps. A substrate having a plurality of fins is provided. An isolation structure is on the substrate surrounding lower portions of the fins. A hybrid fin is formed aside the fins and on the isolation structure. A plurality of gate lines and a dielectric layer are formed. The gate lines are across the fins and the hybrid fin, the dielectric layer is aside the gate lines. A portion of the gate lines is removed, so as to form first trenches in the dielectric layer and in the gate lines, exposing a portion of the hybrid fin and a portion of the fins underlying the portion of the gate lines. The portion of the fins exposed by the first trench and the substrate underlying thereof are removed, so as to form a second trench under the first trench. An insulating structure is formed in the first trench and the second trench.

In accordance with alternative embodiments of the disclosure, a method of forming a FinFET device includes the following steps. A substrate having a plurality of fins is provided. The fins are extending along a first direction. An isolation structure is on the substrate, surrounding lower portions of the fins. A hybrid fin is formed aside the fins and on the isolation structure. A dielectric layer is formed on the substrate and a helmet is formed on the dielectric layer. A plurality of gate lines are formed across the fins and the hybrid fin. The gate lines are extending along a second direction, and the dielectric layer is aside the gate lines. A first cutting process is performed by removing a first portion of at least one of the gate lines to form a first trench in the at least one of the gate lines. The first trench exposes a portion of the hybrid fin. A second cutting process is performed. The second cutting process comprises performing the following processes. A second portion of one of the gate lines is removed to form a second trench in the dielectric layer. The second trench is extending along the second direction and exposing a portion of the fins. The portion of the fins exposed by the second trench and a portion of the substrate under the portion of the fins are removed, so as to form a third trench under the second trench. An insulating structure is formed in the first, second, and third trenches. A protection layer is formed on the insulating structure and on the gate lines.

In accordance with some embodiments of the disclosure, a FinFET device includes a substrate, a plurality of first fins, a plurality of second fins, an isolation structure, a hybrid fin, a plurality of first gate lines, a plurality of second gate lines, and an insulating structure. The first fins and the second fins are on the substrate. The isolation structure surrounds lower portions of the first fins and the second fins. The hybrid fin is on the isolation structure, and aside the first fins and the second fins. The first gate lines are across the first fins. The second gate lines are across the second fins. The insulating structure is on the hybrid fin, located between and separating the first gate lines and the second gate lines, and between the first fins and the second fins. A first part of the insulating structure on the hybrid fin and a second part of the insulating structure on the isolation structure have no interface therebetween.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a FinFET device, comprising:
providing a substrate having a plurality of fins, and an isolation structure thereon surrounding lower portions of the fins;
forming a hybrid fin aside the fins and on the isolation structure, wherein the hybrid fin is formed after forming the isolation structure, and the hybrid fin is formed on a top surface of the isolation structure, and a bottom surface of the hybrid fin is in physical contact with the top surface of the isolation structure;
forming a plurality of gate lines and a dielectric layer, the gate lines are across the fins and the hybrid fin, the dielectric layer is aside the gate lines;
removing a portion of the gate lines, so as to form first trenches in the dielectric layer and in the gate lines, exposing a portion of the hybrid fin and a portion of the fins underlying the portion of the gate lines;
removing the portion of the fins exposed by the first trench and the substrate underlying thereof, so as to form a second trench under the first trench; and
forming an insulating structure in the first trench and the second trench.

2. The method of claim 1, wherein the removing the portion of the gate lines comprising:
forming a first patterned mask on the substrate, exposing a first portion of the gate lines;
performing a first etching process to remove the first portion of the gate lines exposed by the first patterned mask;
removing the first patterned mask;
forming a second patterned mask on the substrate, exposing a second portion of the gate lines; and
performing a second etching process to remove a second portion of the gate lines.

3. The method of claim 2, wherein the forming the first patterned mask layer comprises forming a bottom portion thereof contacting with a top surface of the gate line, and a top surface of a helmet on the dielectric layer.

4. The method of claim 3, wherein the performing the first etching process uses the first patterned mask and the helmet as an etching mask, and the performing the second etching process uses the second patterned mask and the helmet as an etching mask.

5. The method of claim 2, wherein
the forming the first patterned mask comprises forming a first opening therein extending along a first direction, located over the hybrid fin, and across two of the gate lines; and
the forming the second patterned mask comprises forming a second opening extending along a second direction perpendicular to the first direction.

6. The method of claim 1, wherein the removing the portion of the gate lines comprising:
forming a patterned mask on the substrate, wherein the patterned mask has an opening exposing the portion of the gate lines.

7. The method of claim 1, wherein a portion of the insulating structure is formed on and in physical contact with the hybrid fin.

8. The method of claim 1, wherein the insulating structure is formed without any interface therein.

9. A method of forming a FinFET device, comprising:
providing a substrate having a plurality of fins extending along a first direction, and an isolation structure thereon surrounding lower portions of the fins;
forming a hybrid fin aside the fins and on the isolation structure;
forming a dielectric layer on the substrate and a helmet on the dielectric layer;
forming a plurality of gate lines across the fins and the hybrid fin, wherein the gate lines are extending along a second direction, and the dielectric layer is aside the gate lines;
performing a first cutting process by removing a first portion of at east one of the gate lines to form a first trench in the at least one of the gate lines, the first trench exposes a portion of the hybrid fin, and the at least one of the gate lines is cut into a first gate line section and a second gate line section;

performing a second cutting process, comprising:
removing a second portion of one of the gate lines to form a second trench in the dielectric layer, wherein the second trench is extending along the second direction and exposing a portion of the fins; and
removing the portion of the fins exposed by the second trench and a portion of the substrate under the portion of the fins, so as to form a third trench under the second trench;

forming an insulating structure in the first, second, and third trenches, wherein a portion of the insulating structure in the first trench and the hybrid fin underlying thereof are located between the first gate line section and the second gate line section to electrically isolate the first gate line section from the second gate line section; and forming a protection layer on the insulating structure and on the gate lines.

10. The method of claim 9, wherein the first cutting process and the second cutting process are performed simultaneously.

11. The method of claim 10, wherein the first cutting process and the second cutting process are performed by one patterning process using one patterned mask layer.

12. The method of claim 9, wherein the first cutting process and the second cutting process are performed sequentially.

13. The method of claim 12, wherein the first cutting process and the second cutting process are performed by two patterning process using two different patterned mask layers.

14. The method of claim 9, wherein the forming the gate lines comprises:
forming a gate trench in the dielectric layer;
forming a metal gate electrode in the gate trench in the dielectric layer;
performing an etching back process on the metal gate electrode, so as the reduce the height of the metal gate electrode; and
forming an additional protection layer on the metal gate electrode.

15. The method of claim 14, wherein the additional protection layer is formed of a fluorine-free tungsten film.

16. The method of claim 14, wherein the first cutting process and the second cutting process are performed immediately after the gate lines are formed.

17. The method of claim 16, wherein performing the first cutting process and the second cutting process respectively comprises, using a patterned mask layer over the substrate as a mask, the patterned mask layer is filled in a recess on the additional protection layer, the recess is in the dielectric layer and over the gate trench.

18. The method of claim 17, wherein forming the patterned mask layer comprises:
forming a bottom layer which is a BARC layer over the substrate, the bottom layer fills into the recess and overlying a portion of a top surface of the dielectric layer;
forming a middle layer with an opening on the bottom layer;
forming a low temperature oxide layer on the bottom layer and the middle layer;
performing an etching process on the low temperature oxide layer, such that a portion of the low temperature oxide layer on sidewalls of the middle layer is remained; and
patterning the bottom layer with the middle layer and the remained low temperature oxide layer as a mask.

19. A method of forming a FinFET device, comprising:
providing a substrate having a plurality of fins, and an isolation structure thereon surrounding lower portions of the fins;
forming a hybrid fin aside the fins and on the isolation structure, wherein the fins are formed of a semiconductor material, and the hybrid fin is formed of a dielectric material;
forming a plurality of gate lines and a dielectric layer, the gate lines are across the fins and the hybrid fin, the dielectric layer is aside the gate lines;
removing a portion of the gate lines, so as to form first trenches in the dielectric layer and in the gate lines, exposing a portion of the hybrid fin and a portion of the fins underlying the portion of the gate lines;
removing the portion of the fins exposed by the first trench and the substrate underlying thereof, so as to form a second trench under the first trench; and
forming an insulating structure in the first trench and the second trench.

20. The method of claim 19, wherein the hybrid fin is formed on and in physical contact with a top surface of the isolation structure.

* * * * *